(12) United States Patent
Kim et al.

(10) Patent No.: US 9,978,756 B2
(45) Date of Patent: May 22, 2018

(54) SEMICONDUCTOR CHIPS AND METHODS OF MANUFACTURING THE SAME

(71) Applicant: Samsung Electronics Co., Ltd., Suwon-si, Gyeonggi-do (KR)

(72) Inventors: Hyuk Kim, Seongnam-si (KR); Seung-pil Chung, Seongnam-si (KR); Jae-ho Min, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/412,689

(22) Filed: Jan. 23, 2017

(65) Prior Publication Data

US 2017/0330887 A1 Nov. 16, 2017

(30) Foreign Application Priority Data

May 16, 2016 (KR) .......................... 10-2016-0059786

(51) Int. Cl.
*H01L 23/52* (2006.01)
*H01L 27/112* (2006.01)
*H01L 23/528* (2006.01)

(52) U.S. Cl.
CPC ...... *H01L 27/11286* (2013.01); *H01L 23/528* (2013.01)

(58) Field of Classification Search
CPC ............ H01L 27/11286; H01L 23/528; H01L 23/5283; H01L 23/522; H01L 23/535; H01L 27/1116; H01L 27/10897; H01L 27/11526; H01L 27/11548
See application file for complete search history.

(56) References Cited

U.S. PATENT DOCUMENTS

| | | | |
|---|---|---|---|
| 8,338,882 B2 | 12/2012 | Tanaka et al. | |
| 9,035,371 B2 | 5/2015 | Nakajima | |
| 2003/0155588 A1* | 8/2003 | Murade | G02F 1/136209 257/213 |
| 2013/0105902 A1 | 5/2013 | Uenaka et al. | |
| 2015/0102346 A1* | 4/2015 | Shin | H01L 27/1157 257/66 |
| 2015/0129878 A1* | 5/2015 | Shin | H01L 27/11578 257/66 |
| 2015/0279852 A1 | 10/2015 | Mizutani et al. | |
| 2015/0294982 A1 | 10/2015 | Bellaiche | |
| 2015/0325301 A1 | 11/2015 | Nam | |
| 2015/0325588 A1 | 11/2015 | Lee et al. | |
| 2015/0372000 A1 | 12/2015 | Jee et al. | |
| 2015/0372005 A1 | 12/2015 | Yon et al. | |

* cited by examiner

*Primary Examiner* — Yosef Gebreyesus
(74) *Attorney, Agent, or Firm* — Myers Bigel, P.A.

(57) ABSTRACT

Semiconductor chips are provided. A semiconductor chip includes a peripheral circuit region on a substrate. The semiconductor chip includes a semiconductor layer on the peripheral circuit region. The semiconductor chip includes a cell region on the semiconductor layer. Moreover, the semiconductor chip includes a layer/connector that is adjacent the semiconductor layer. Methods of manufacturing semiconductor chips are also provided.

20 Claims, 41 Drawing Sheets

SEMICONDUCTOR CHIPS AND METHODS OF MANUFACTURING THE SAME

CROSS-REFERENCE TO RELATED APPLICATION

This U.S. non-provisional patent application claims the benefit of Korean Patent Application No. 10-2016-0059786, filed on May 16, 2016, in the Korean Intellectual Property Office, the disclosure of which is hereby incorporated herein in its entirety by reference.

BACKGROUND

The present disclosure relates to semiconductor devices. There has been increased demand for small-sized electronic appliances that process large amounts of data at high speed. Accordingly, it may be beneficial to increase the degree of integration of semiconductor chips used in electronic appliances and to reduce RC delay.

SUMMARY

Various embodiments of present inventive concepts provide a highly-integrated semiconductor chip with reduced RC delay and including a peripheral circuit area and a cell area formed on different regions in a vertical direction of a substrate.

Various embodiments of present inventive concepts provide a method of manufacturing a semiconductor chip having high reliability.

A semiconductor chip, according to some embodiments of present inventive concepts, may include a peripheral circuit region on a substrate. The semiconductor chip may include a semiconductor layer on the peripheral circuit region. The semiconductor chip may include a layer that is electrically connected to, and extends laterally adjacent a side of, the semiconductor layer. Moreover, the semiconductor chip may include a cell region on the semiconductor layer.

According to some embodiments, a semiconductor chip may include a peripheral circuit on a substrate. The semiconductor chip may include a semiconductor layer on the peripheral circuit. The semiconductor chip may include a layer at a same layer level as the semiconductor layer and electrically connected to a portion of the semiconductor layer. Moreover, the semiconductor chip may include a cell region that is on the semiconductor layer and that includes a transistor of a memory cell.

A semiconductor chip, according to some embodiments, may include a peripheral circuit region that is on a substrate and that includes a peripheral circuit. The semiconductor chip may include a semiconductor layer on the peripheral circuit region on the substrate. The semiconductor chip may include an arm layer electrically connected to a part of the semiconductor layer and formed at a same layer level as the semiconductor layer on the substrate. Moreover, the semiconductor chip may include a cell region including a memory cell array that includes a channel layer extending in a direction perpendicular to the semiconductor layer, a plurality of gate electrode layers and a plurality of insulating layers stacked on the semiconductor layer to be adjacent the channel layer, and a gate insulating layer between the channel layer and the plurality of gate electrode layers.

A method of manufacturing a semiconductor chip, according to some embodiments, may include partitioning a substrate into a plurality of chip regions. The method may include forming a peripheral circuit including a peripheral circuit gate structure on the substrate that is partitioned into the chip regions. The method may include forming an interlayer insulating layer on the peripheral circuit. The method may include forming a lower wiring structure electrically connected to the peripheral circuit gate structure in the interlayer insulating layer. The method may include forming a semiconductor layer on the interlayer insulating layer and the lower wiring structure. The method may include forming a layer that is electrically connected to the semiconductor layer and that electrically connects the chip regions to one another. The method may include forming a memory cell on the semiconductor layer. Moreover, the method may include forming an upper wiring structure and a peripheral circuit wiring structure respectively connected to the memory cell and the peripheral circuit.

A semiconductor chip, according to some embodiments, may include a substrate. The semiconductor chip may include a memory cell region on the substrate. The semiconductor chip may include a peripheral circuit region between the memory cell region and the substrate. The peripheral circuit region may include circuitry configured to process data input into and/or output from the memory cell region. The semiconductor chip may include a semiconductor layer between the memory cell region and the peripheral circuit region. Moreover, the semiconductor chip may include a connector that extends laterally from a perimeter portion of the semiconductor layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

FIGS. 1A to 1D are diagrams of a semiconductor chip according to some embodiments.

Figure 1A:
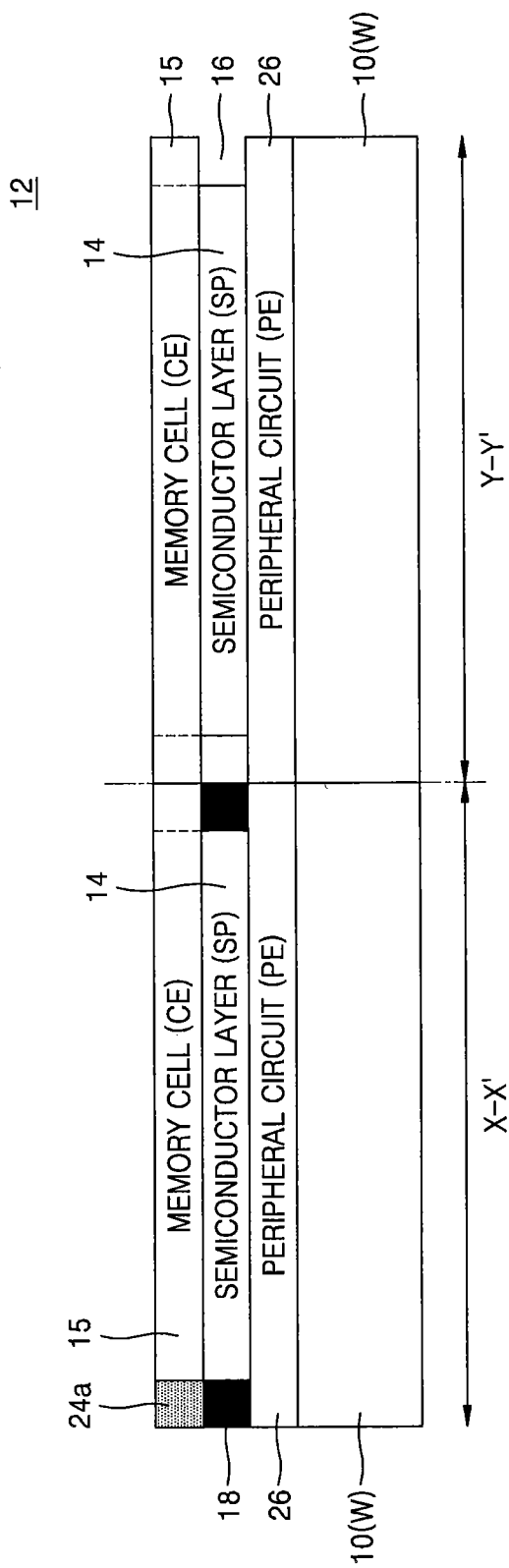
FIGS. 1A to 1D are diagrams of a semiconductor chip according to some embodiments.
Figure 1B:
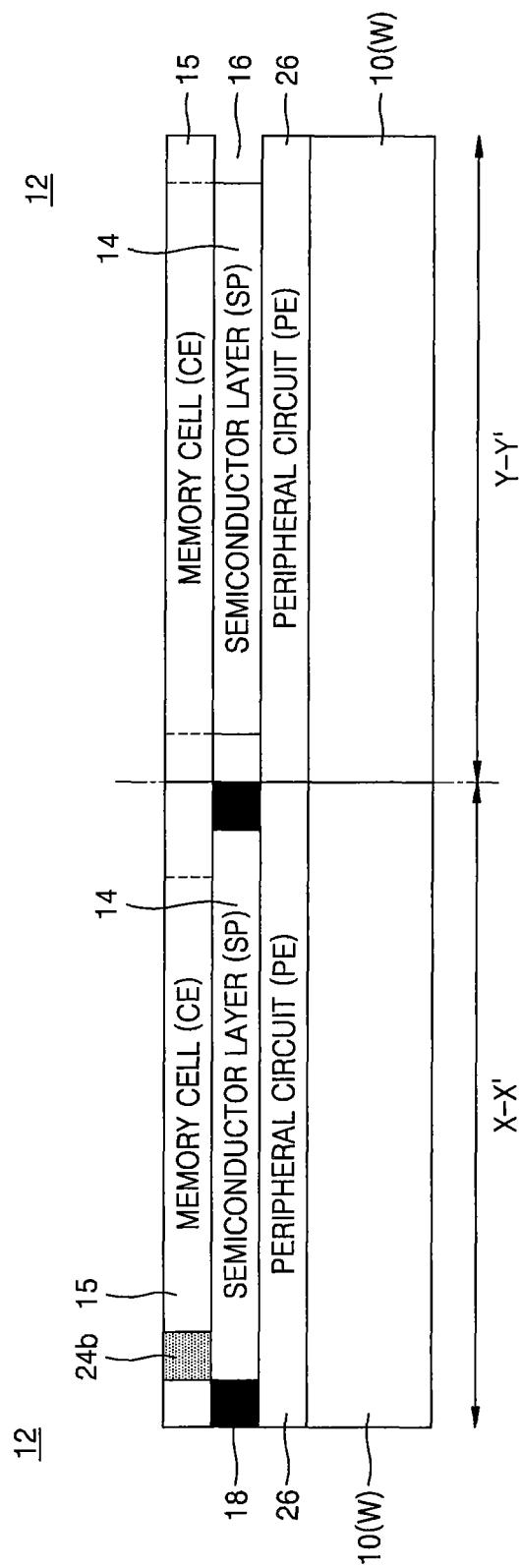
Figure 1C:
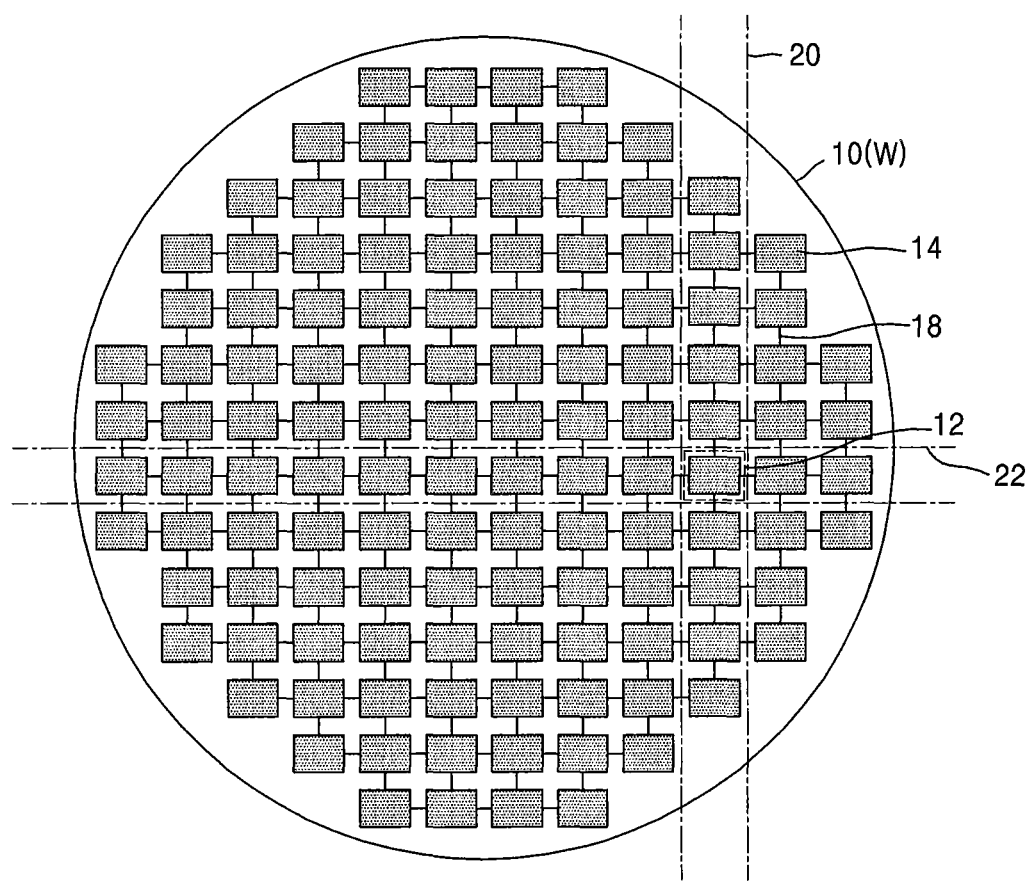
Figure 1D:
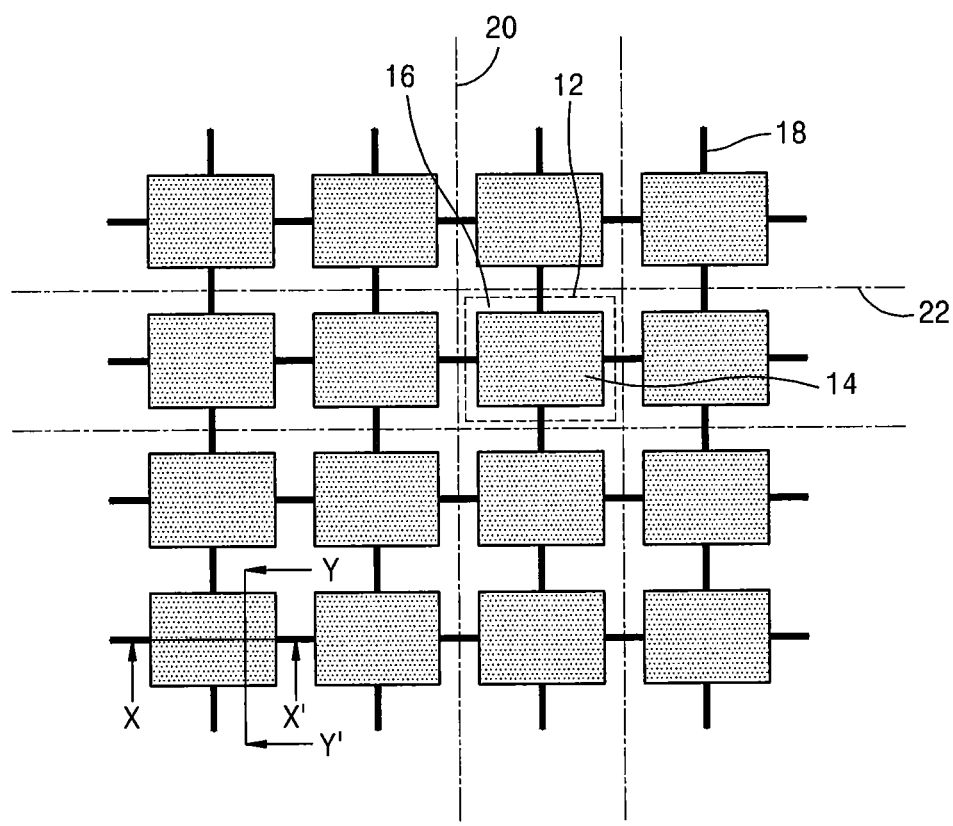

In detail, FIGS. 1A and 1B are cross-sectional views of a semiconductor chip 12. FIGS. 1A and 1B are cross-sectional views of the semiconductor chip 12 respectively taken along a line X-X' and Y-Y' of FIG. 1D. FIGS. 1C and 1D are plan views of a semiconductor layer 14 level in the semiconductor chip 12 implemented on a substrate 10 (W). FIG. 1D is a partially enlarged view of the semiconductor chip 12 of FIG. 1C.

Referring to FIGS. 1A and 1B, the semiconductor chip 12 may include a peripheral circuit region 26 on the substrate 10 (W). The substrate 10 may include a wafer, e.g., a silicon wafer. The peripheral circuit region 26 may include peripheral circuits PE. The peripheral circuits PE may be circuits capable of processing data input into/output from a cell region 15 at a high speed.

For example, the peripheral circuits PE may include a page buffer, a latch circuit, a cache circuit, a row decoder, a column decoder, a sense amplifier, or a data in/out circuit.

The semiconductor layer 14 may be formed on the peripheral circuit region 26. The semiconductor layer 14 may function as a second substrate. The semiconductor layer 14 may include a semiconductor pattern SP. In some embodiments, the semiconductor layer 14 may include a polysilicon layer. In some embodiments, the semiconductor layer 14 may include a single-crystalline silicon layer.

An arm layer 18 that is electrically connected to the semiconductor layer 14 is formed on a side of the semiconductor layer 14. The arm layer 18 is not limited to an "arm," and thus may be referred to as "a layer electrically connected to the semiconductor layer" 14. Moreover, the arm layer 18 is not limited to a "layer," and thus may be referred to as "a connector" (or "a connector region" or "a connector material"). The arm layer 18 may be a material layer formed to reliably fabricate a memory cell CE of the cell region 15, as will be described later. The arm layer 18 may be formed at the same layer level as the semiconductor layer 14. The arm layer 18 may be an arm pattern that is electrically connected to a part/portion of the semiconductor layer 14. The arm layer 18 may be formed on a boundary area 16 (e.g., a perimeter/edge/side portion) of the semiconductor layer 14. The arm layer 18 may extend laterally (i.e., in the x-direction or in the y-direction) from the perimeter/edge/side portion of the semiconductor layer 14 and may connect (e.g., electrically connect) the semiconductor layer 14 to the substrate 10.

In some embodiments, the arm layer 18 may include a material that is the same as that of the semiconductor layer 14. For example, the arm layer 18 may be a polysilicon layer or a single-crystalline layer. In some embodiments, the arm layer 18 may include a different material from that of the semiconductor layer 14, e.g., a conductive layer. The conductive layer in/of the arm layer 18 may be a metal layer including, e.g., aluminium (Al), copper (Cu), silver (Ag), gold (Au), tungsten, titanium, tantalum, titanium nitride, and tantalum nitride.

The cell region 15 including the memory cell CE (or a memory cell array) may be formed on the semiconductor layer 14. The memory cell CE may be disposed on the substrate 10 (W) so as to overlap with the peripheral circuits PE. The cell region 15 may include a plurality of transistors, as will be described later. The cell region 15 may include horizontal type (or flat plate type) memory cells or vertical type memory cells. The horizontal type memory cells may each include a transistor formed on the semiconductor layer 14 in a horizontal direction. The vertical type memory cells may each include a transistor formed on the semiconductor layer 14 in a vertical direction.

For example, the vertical type memory cell may include a memory cell CE including a channel layer extending perpendicularly to the semiconductor layer 14, a plurality of gate electrode layers and a plurality of insulating layers stacked on the semiconductor layer 14 adjacent to the channel layer, and a gate insulating layer disposed between the channel layer and one of the gate electrode layers.

Pad regions 24a and 24b may be formed on a side of the cell region 15. The pad regions 24a and 24b may be formed at the same layer level as the cell region 15 or at an upper level of the cell region 15. In some embodiments, as shown in FIG. 1A, the pad region 24a is not formed on a top surface of the semiconductor layer 14, but rather the pad region 24a may overlap the arm layer 18 in a vertical direction. Alternatively, in some embodiments, as shown in FIG. 1B, the pad region 24b may be formed on a top surface of the semiconductor layer 14 and may not overlap (e.g., but rather may be offset from) the arm layer 18 in the vertical direction.

Next, referring to FIGS. 1C and 1D, a plurality of semiconductor chips 12 may be arranged on the substrate 10 (W) to be spaced apart from one another. In each of the semiconductor chips 12, the semiconductor layer 14 may be formed. The boundary area 16 may be disposed at a boundary (e.g., a sidewall) of the semiconductor layer 14. An area of the boundary area 16 and an area of the semiconductor layer 14 may vary depending on design conditions of the semiconductor chip 12.

The arm layer 18 that is electrically connected to the semiconductor layer 14 may be disposed on the boundary area 16. The arm layer 18 may be an arm pattern connected to a part (e.g., a portion) of the semiconductor layer 14. In FIGS. 1C and 1D, the arm layer 18 may be formed on all four sides of the semiconductor layer 14, for convenience of description. Alternatively, the arm layer 18 may be formed on only one side of the semiconductor layer 14, provided that the plurality of semiconductor layers 14 may be connected to one another via the arm layer 18 on the substrate 10. The arm layer 18 may be a material layer formed to reliably fabricate the memory cell CE that configures (e.g., that provides/is included in) the cell region 15, as will be described later.

After manufacturing the plurality of semiconductor chips 12 on the substrate 10, the substrate 10 is cut along X-axis cutting lines 22 and Y-axis cutting lines 20 to obtain individual semiconductor chips 12. The arm layer 18 may be located in/within the individual semiconductor chip 12 even when/after the substrate 10 is cut. An outermost (e.g., cut) portion of the arm layer 18 thus corresponds to a cut of the semiconductor chips 12.

Figure 2A:
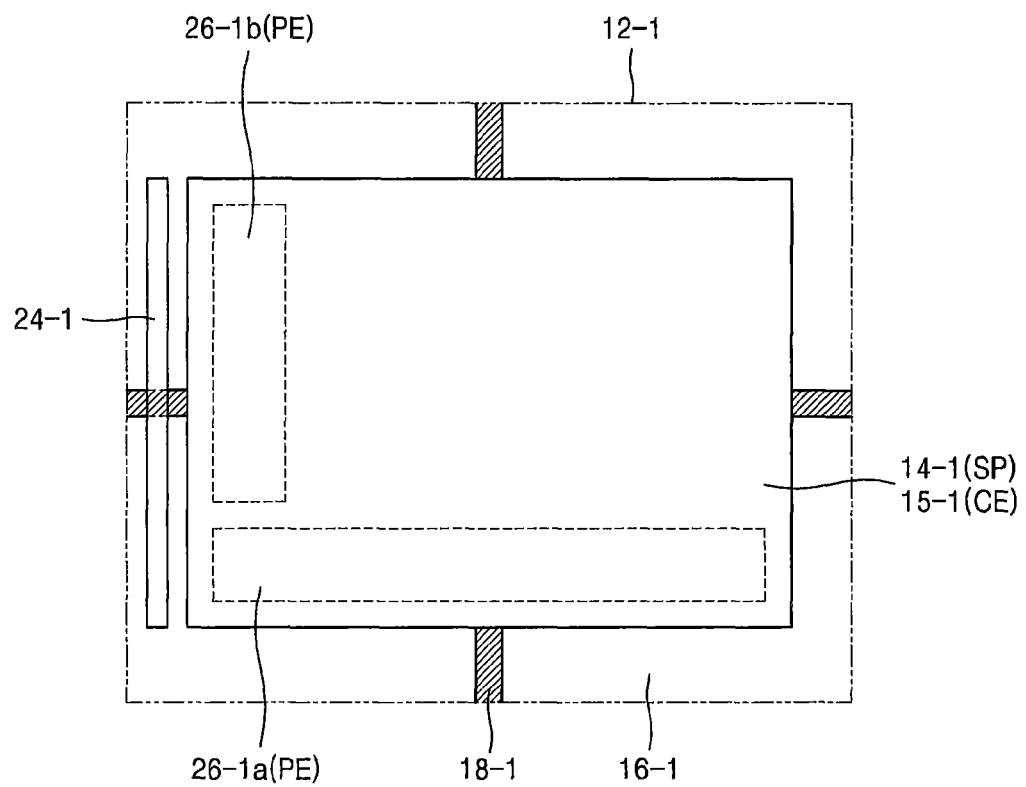
FIGS. 2A to 2C are layouts of a semiconductor chip according to some embodiments.
Figure 2B:
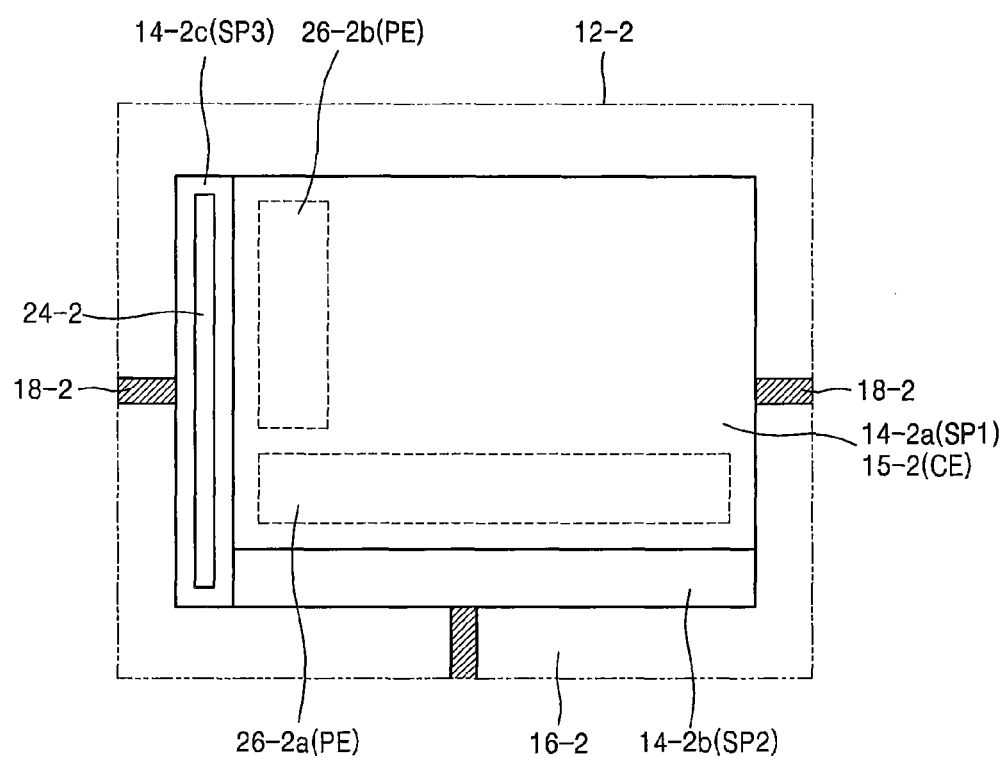
Figure 2C:
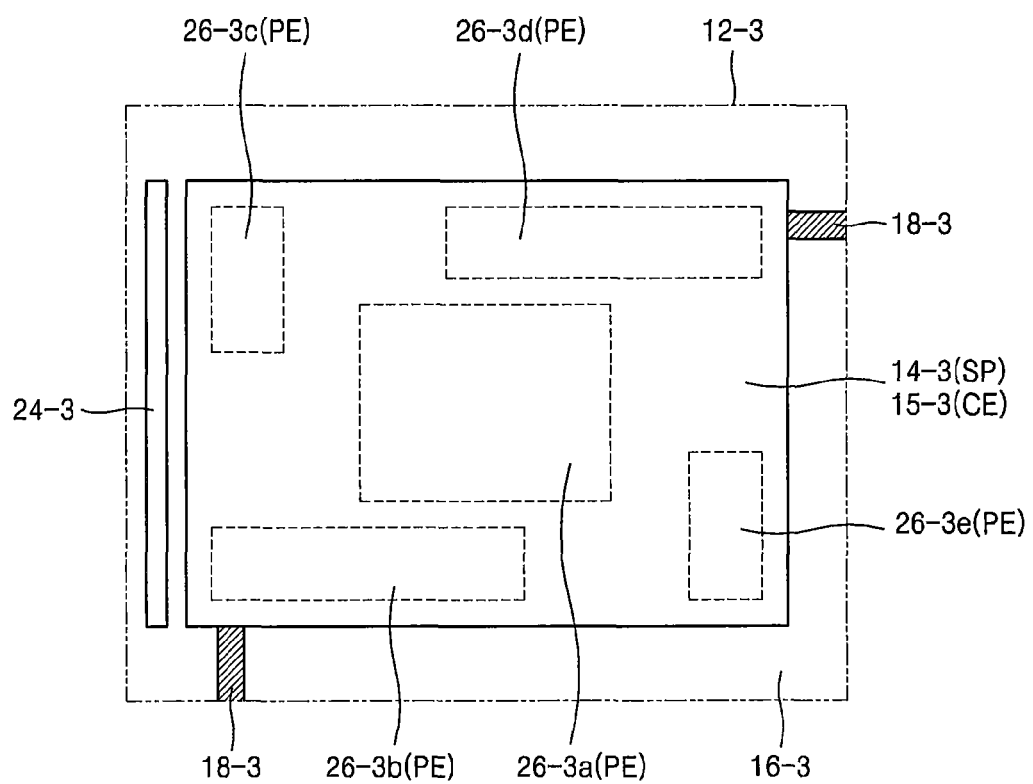

FIGS. 2A to 2C are layouts of semiconductor chips 12-1, 12-2, and 12-3 according to some embodiments.

In particular, FIGS. 2A to 2C show layouts of various semiconductor chips 12-1, 12-2, and 12-3, but one or more embodiments are not limited to the above examples.

The semiconductor chip 12-1 shown in FIG. 2A may include a semiconductor layer 14-1 and a cell region 15-1 on a center portion thereof. The semiconductor layer 14-1 includes a semiconductor pattern SP, and the cell region 15-1 may include the memory cell CE. Peripheral circuit regions 26-1a and 26-1b may be arranged on lower portions of the semiconductor layer 14-1 and the cell region 15-1. The peripheral circuit regions 26-1a and 26-1b may be arranged on a substrate. The peripheral circuit regions 26-1a and 26-1b may each include a peripheral circuit PE. The peripheral circuit regions 26-1a and 26-1b may be overlapped by the semiconductor layer 14-1 and the cell region 15-1. The peripheral circuit regions 26-1a and 26-1b may include the peripheral circuit region 26-1a arranged in a horizontal direction and the peripheral circuit region 26-1b arranged in a vertical direction.

A boundary area 16-1 may be disposed on boundaries of the semiconductor layer 14-1 and the cell region 15-1. An arm layer 18-1 may be arranged on the boundary area 16-1. The arm layer 18-1 may be an arm pattern that is connected to a part of the semiconductor layer 14-1, as described above.

A pad region 24-1 may be disposed at a side of the semiconductor layer 14-1 and the cell region 15-1. The pad region 24-1 may correspond to the reference numeral 24a shown in FIG. 1A. The pad region 24-1 may overlap the arm layer 18-1 in a vertical direction at a side of the semiconductor layer 14-1 and the cell region 15-1. In FIG. 2A, the pad region 24-1 is arranged at a left side of the semiconductor layer 14-1 and the cell region 15-1, but may be arranged at a right side, an upper side, or a lower side of the semiconductor layer 14-1 and the cell region 15-1.

The semiconductor chip 12-2 shown in FIG. 2B may include first to third semiconductor layers 14-2a, 14-2b, and 14-2c and a cell region 15-2 on a center portion thereof. The semiconductor layers 14-2a, 14-2b, and 14-2c may include the first semiconductor layer 14-2a that is overlapped by a cell region 15-2 and peripheral circuit regions 26-2a and 26-2b, the second semiconductor layer 14-2b that is not overlapped by the cell region 15-2 or the pad region 24-2, and the third semiconductor layer 14-2c that overlaps with the pad region 24-2. The first to third semiconductor layers 14-2a, 14-2b, and 14-2c may respectively include semiconductor patterns SP1, SP2, and SP3. The cell region 15-2 may include a memory cell CE.

The peripheral circuit regions 26-2a and 26-2b may be arranged on lower portions of the first semiconductor layer 14-2a and the cell region 15-2. The peripheral circuit regions 26-2a and 26-2b may be disposed to underlap (i.e., extend under and thus be overlapped by) the first semiconductor layer 14-2a and the cell region 15-2. A boundary area 16-2 may be disposed on boundaries of the semiconductor layers 14-2a, 14-2b, and 14-2c and the cell region 15-2. An arm layer 18-2 may be disposed on the boundary area 16-2. The arm layer 18-2 may be an arm pattern that is electrically connected to a part of the semiconductor layers 14-2a, 14-2b, and 14-2c as described above.

A pad region 24-2 may be disposed at a side of the semiconductor layers 14-2a, 14-2b, and 14-2c, and the cell region 15-2. The pad region 24-2 may vertically overlap the semiconductor layer 14-2c. The pad region 24-2 may correspond to a reference numeral 24b of FIG. 1B. In FIG. 2B, the pad region 24-2 is disposed at a left side of the first semiconductor layer 14-2a and the cell region 15-2, but it may be disposed at a right side, an upper side, or a lower side of the first semiconductor layer 14-2a and the cell region 15-2.

The semiconductor chip 12-3 of FIG. 2C may include a semiconductor layer 14-3 and a cell region 15-3 on a center portion thereof. The semiconductor layer 14-3 may include a semiconductor pattern SP. The cell region 15-3 may include a memory cell CE.

A plurality of peripheral circuit regions 26-3a, 26-3b, 26-3c, 26-3d, and 26-3e may be disposed on lower portions of the semiconductor layer 14-3 and the cell region 15-3. The peripheral circuit regions 26-3a, 26-3b, 26-3c, 26-3d, and 26-3e may include peripheral circuits PE. The peripheral circuit regions 26-3a, 26-3b, 26-3c, 26-3d, and 26-3e may underlap the semiconductor layer 14-3 and the cell region 15-3.

A boundary area 16-3 may be disposed on boundaries of the semiconductor layer 14-3 and the cell region 15-3. An arm layer 18-3 may be disposed on the boundary area 16-3. The arm layer 18-3 may be an arm pattern that is electrically connected to a part of the semiconductor layer 14-3, as described above. A pad region 24-3 may be disposed at a side of the semiconductor layer 14-3 and the cell region 15-3.

The pad region 24-3 may not overlap the semiconductor layer 14-3 in a vertical direction, but rather may be offset from the semiconductor layer 14-3 such that a vertical axis does not pass through both the pad region 24-3 and the semiconductor layer 14-3. The pad region 24-3 may correspond to a reference numeral 24a of FIG. 1A. In FIG. 2C, the pad region 24-3 is disposed at a left side of the semiconductor layer 14-3 and the cell region 15-3, but it may be disposed at a right side, an upper side, or a lower side of the semiconductor layer 14-3 and the cell region 15-3.

Hereinafter, semiconductor chips implemented according to some embodiments described above with reference to FIGS. 1A to 1D and FIGS. 2A to 2C will be described below.

FIGS. 3A to 3D are diagrams of a semiconductor chip 1000 according to some embodiments.

Figure 3A:
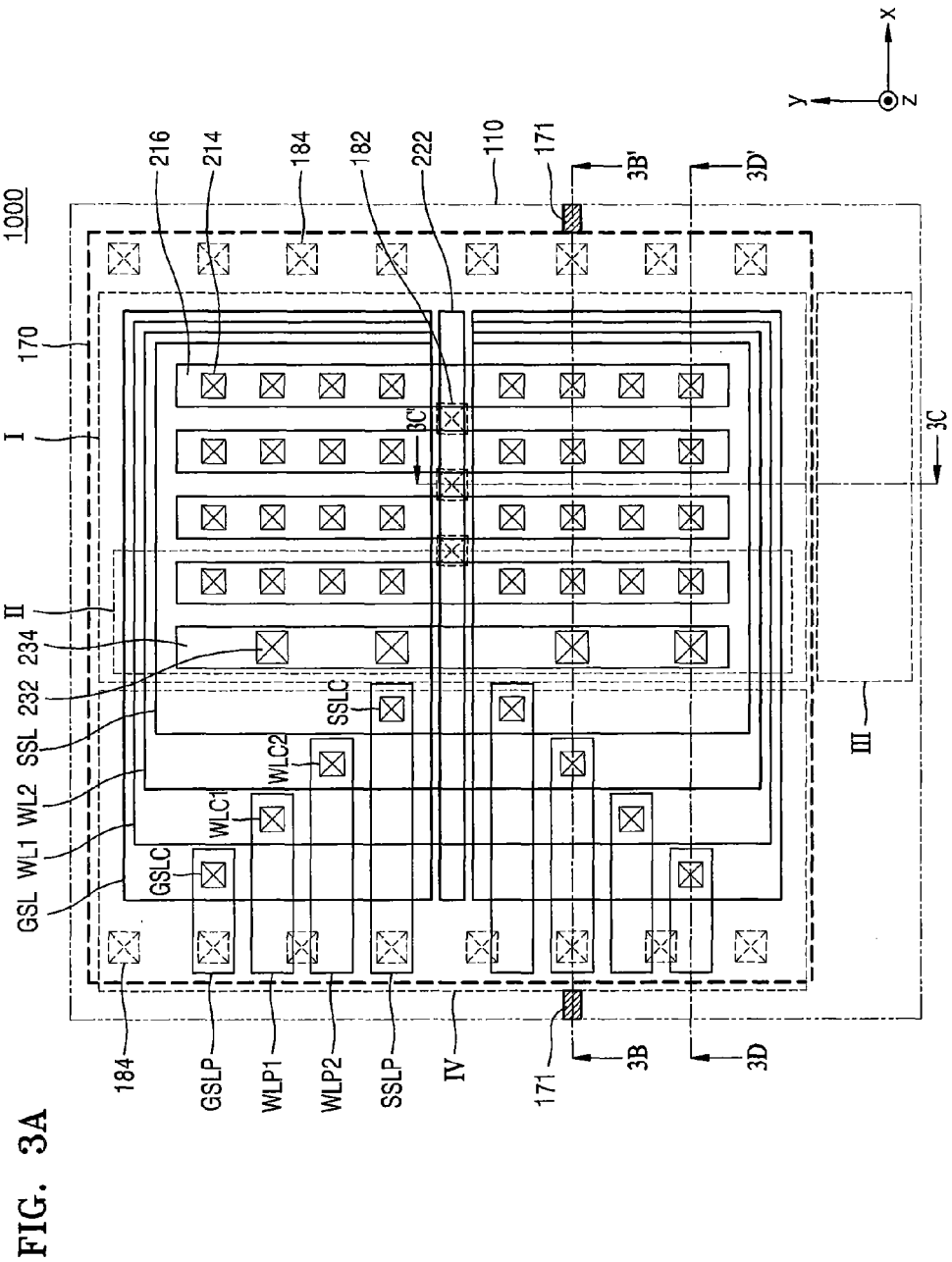
FIGS. 3A to 3D are diagrams of a semiconductor chip according to some embodiments.
Figure 3B:
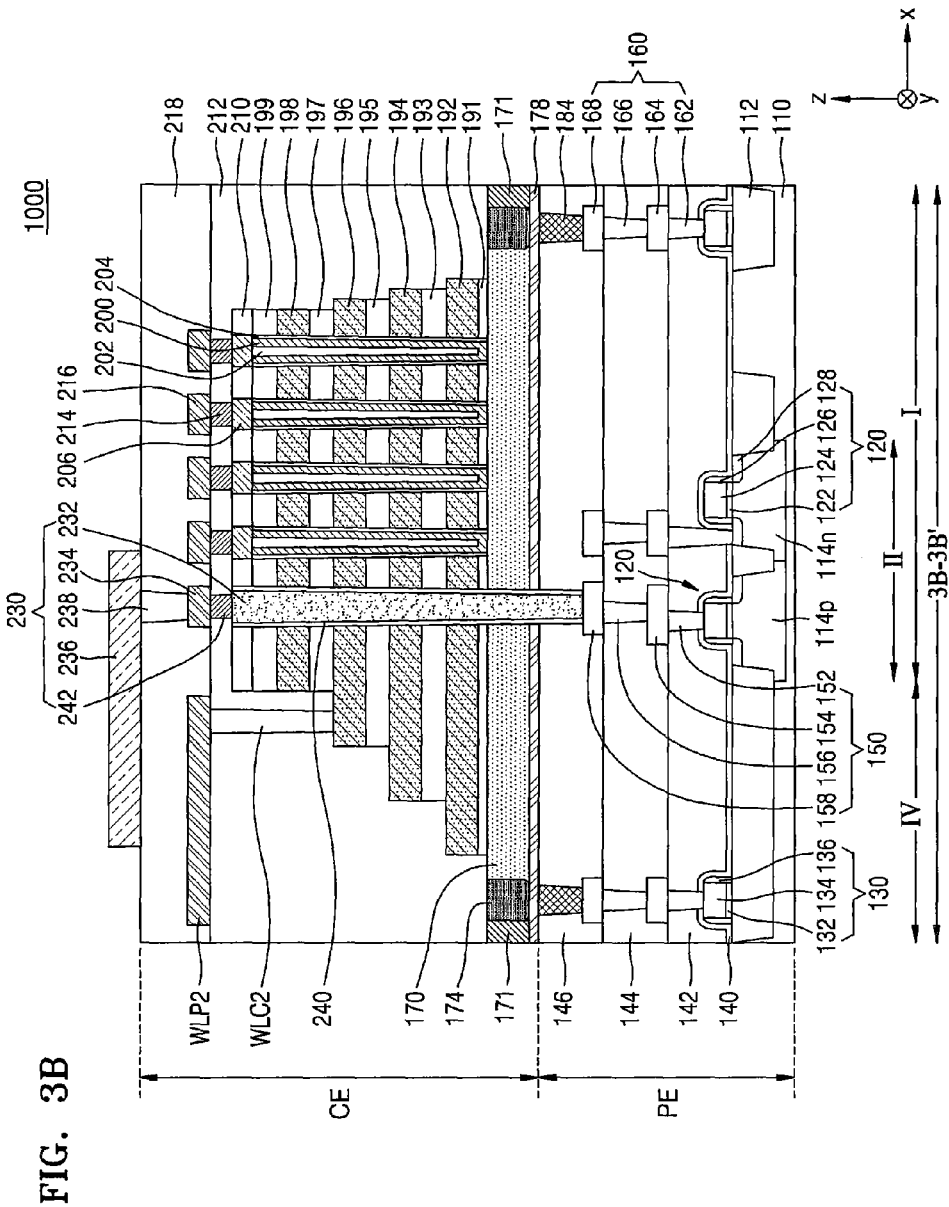
Figure 3C:
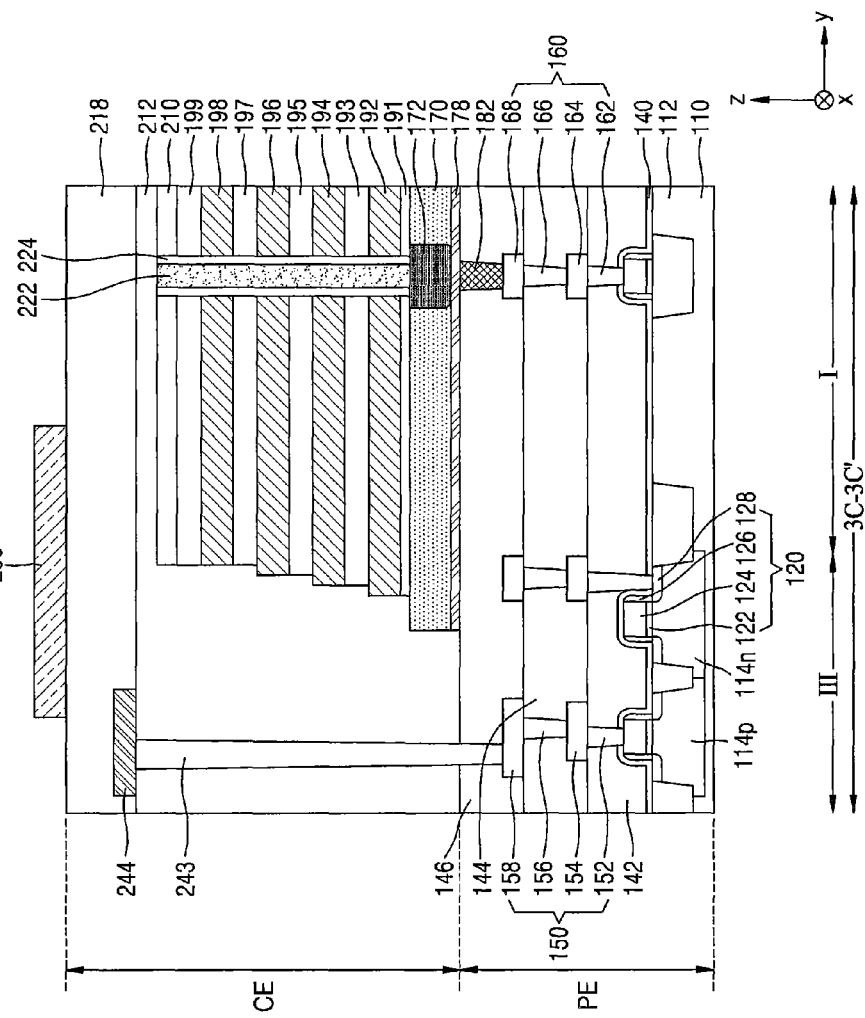
Figure 3D:
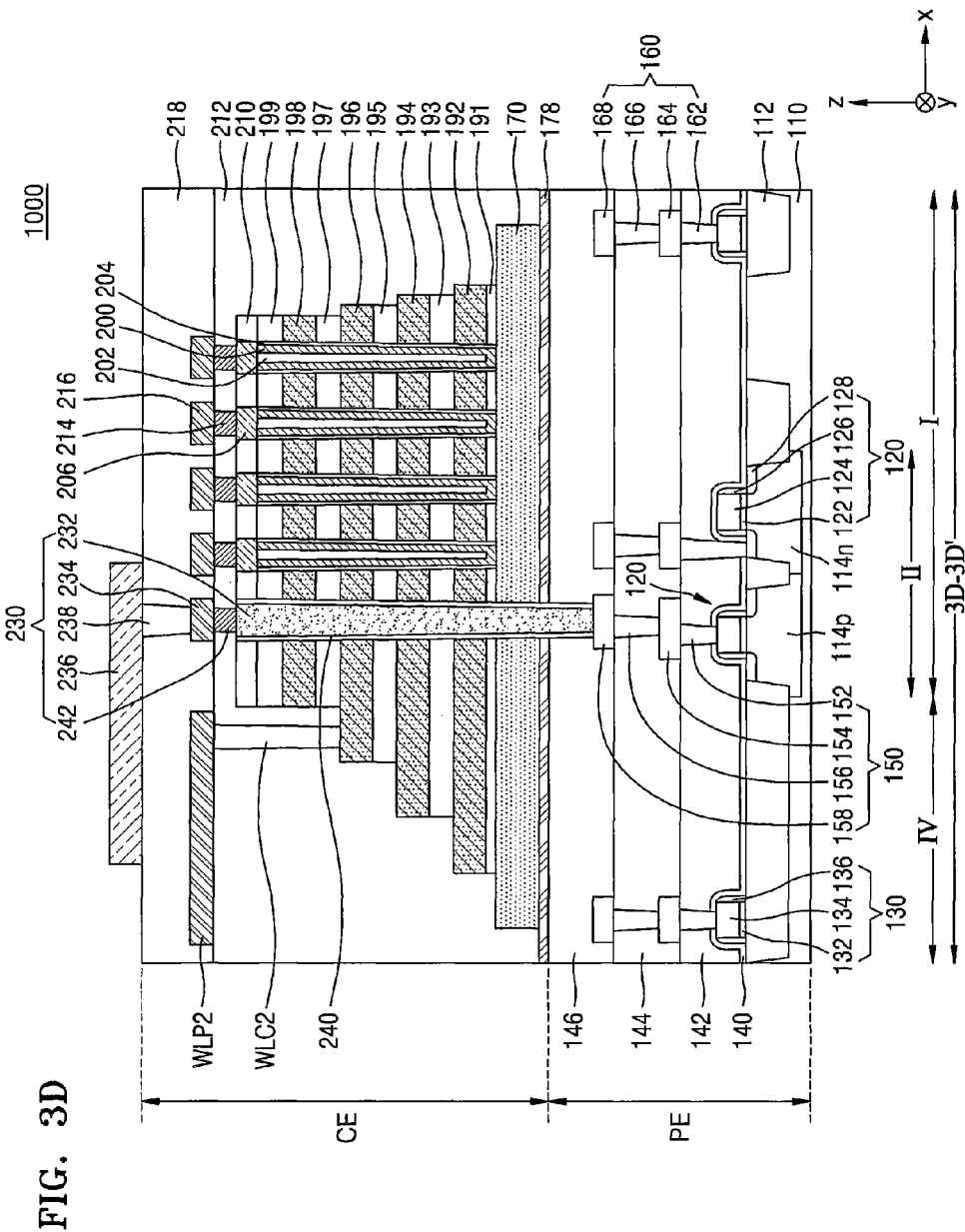

In more detail, FIG. 3A shows a layout of the semiconductor chip 1000 according to some embodiments, and FIGS. 3B to 3D are cross-sectional views of the semiconductor chip 1000. FIGS. 3B, 3C, and 3D respectively illustrate the semiconductor chip 1000 taken along lines 3B-3B', 3C-3C', and 3D-3D' of FIG. 3A. The semiconductor chip 1000 may correspond to the semiconductor chip 12 of FIGS. 1A-2C.

Referring to FIG. 3A to 3D, a substrate 110 of the semiconductor chip 1000 may include a cell region I, a first peripheral circuit region II, a second peripheral circuit region III, and a pad region IV. Areas of the cell region I, the first peripheral circuit region II, the second peripheral circuit region III, and the pad region IV are illustrated for convenience of description, and may vary depending on designs of the semiconductor chip 1000. The cell region I may be a region where vertical type memory cells are arranged. The first and second peripheral circuit regions II and III may be regions where peripheral circuits for driving the vertical type memory cells may be arranged.

The first peripheral circuit region II may be disposed under the cell region I so as to be vertically overlapped by the cell region I. The peripheral circuits arranged in the first peripheral circuit region II may process data input into/output from the cell region I at a high speed. For example, the peripheral circuits may include a page buffer, a latch circuit, a cache circuit, a column decoder, a sense amplifier, or a data in/out circuit.

The second peripheral circuit region III may be disposed on a side of the cell region I, and may be disposed to not be overlapped by the cell region I and/or the first peripheral circuit region II. The peripheral circuits formed in the second peripheral circuit region III may be, e.g., row decoders.

FIG. 3A shows that the peripheral circuits arranged in the second peripheral circuit region III are not overlapped by the cell region I, but the layout of the second peripheral circuit region III is not limited to the above example, that is, the peripheral circuits arranged in the second peripheral circuit region III may, in some embodiments, be formed under the cell region I. The pad region IV may be formed on the other side of the cell region I. The pad region IV may include a wiring layer connected to word lines of the vertical memory cells in the cell region I.

An active area may be defined on the first peripheral circuit region II of the substrate 110 by a device isolation layer 112. A peripheral circuit p-well 114$p$ and a peripheral circuit n-well 114$n$ may be formed on the active area. An NMOS transistor may be formed on the peripheral circuit p-well 114$p$ and a PMOS transistor may be formed on the peripheral circuit n-well 114$n$. A peripheral circuit gate structure 120 may be formed on the active area of the substrate 110. The peripheral circuit gate structure 120 may include a peripheral circuit gate insulating layer 122, a peripheral circuit gate electrode layer 124, a peripheral circuit spacer 126, and source/drain regions 128.

A dummy gate structure 130 may be formed on a field region of the substrate 110, that is, on the device isolation layer 112. The dummy gate structure 130 may be overlapped by the cell region I, or may be disposed along an outline of the cell region I. The dummy gate structure 130 may include a dummy gate insulating layer 132, a dummy gate electrode layer 134, and a dummy spacer 136.

A first etch-stop layer 140 may cover the peripheral circuit gate structure 120 and the dummy gate structure 130 on the substrate 110. The first etch-stop layer 140 may include an insulating material such as silicon nitride or silicon oxynitride, and may be formed to a predetermined thickness in order to conformally cover the peripheral circuit gate structure 120 and the dummy gate structure 130.

First to third interlayer insulating layers 142, 144, and 146 may be sequentially stacked on the first etch-stop layer 140. The first to third interlayer insulating layers 142, 144, and 146 may include silicon oxide, silicon oxynitride, or silicon nitride.

A lower wiring structure 150 is formed in the first to third interlayer insulating layers 142, 144, and 146, and may be connected to the peripheral circuit gate structure 120. The lower wiring structure 150 may include a first wire contact 152, a first lower wiring layer 154, a second wire contact 156, and a second lower wiring layer 158. The first lower wiring layer 154 is formed on the first interlayer insulating layer 142, and may be electrically connected to the peripheral circuit gate structure 120 via the first wire contact 152. The second lower wiring layer 158 may be formed on the second interlayer insulating layer 144, and may be electrically connected to the first lower wiring layer 154 via the second wire contact 156.

The first and second lower wiring layers 154 and 158 may include metal or metal silicide material having a high melting point. In one or more example embodiments, the first and second lower wiring layers 154 and 158 may include metal such as tungsten, molybdenum, titanium, cobalt, tantalum, and nickel, and a conductive material such as tungsten silicide, titanium silicide, cobalt silicide, tantalum silicide, and nickel silicide.

In addition, in FIGS. 3B to 3D, the lower wiring structure 150 has a structure, in which the two lower wiring layers 154 and 158 are connected to each other via the two wire contacts 152 and 156. The lower wiring structure 150, however, may have a structure in which three or more lower wiring layers are connected to one another via three or more wire contacts, according to a layout of the first peripheral circuit region II and kinds/types and arrangements of the peripheral circuit gate structure.

A dummy wiring structure 160 may be connected to the dummy gate structure 130 in/via the first to third interlayer insulating layers 142, 144, and 146. The dummy wiring structure 160 may include a first dummy wire contact 162, a first dummy wiring layer 164, a second dummy wire contact 166, and a second dummy wiring layer 168.

A semiconductor layer 170 may be formed on the third interlayer insulating layer 146. The semiconductor layer 170 may correspond to the reference numeral 14 in FIGS. 1A to 1D, and FIGS. 2A to 2C. In some example embodiments, the semiconductor layer 170 may be overlapped by the cell region I and the pad region IV, and the semiconductor layer 170 may not be formed on a part of the second peripheral circuit region III.

The semiconductor layer 170 may function as a second substrate on which vertical type memory cells are to be formed. A memory cell CE is formed on the semiconductor layer 170, that is, an upper portion in a z-axis direction, and a peripheral circuit PE may be formed under the semiconductor layer 170, that is, a lower portion in the z-axis direction. In one or more example embodiments, the semiconductor layer 170 may include a single-crystalline silicon layer. In one or more example embodiments, the semiconductor layer 170 may include a polysilicon layer doped with impurities. For example, the semiconductor layer 170 may include a polysilicon layer doped with n-type impurities. The semiconductor layer 170 may be formed to a thickness of about 20 nm to about 500 nm, but is not limited thereto.

A common source region 172 that extends in a first direction (x-axis direction in FIG. 3C) parallel with a main surface of the substrate 110 may be formed in the semiconductor layer 170 within the cell region I. The common source region 172 may be an impurity region where the n-type impurities of high concentration are doped, and the common source region 172 and the p-well in the semiconductor layer 170 may form a p-n junction diode. The common source region 172 may function as a source region supplying electric current to the vertical type memory cells.

A p+ well 174 may be formed in the semiconductor layer 170 outside the cell region I. For example, a plurality of p+ wells 174 that are spaced apart from one another may be arranged on an edge portion of the semiconductor layer 170 in a second direction (y-axis direction in FIG. 3A) that is in parallel with the main surface of the substrate 110. Each p+ well 174 may be an impurity region doped with the p-type impurities of high concentration. Each p+ well 174 may supply electric current into the p-well formed in the semiconductor layer 170 so that the memory cells may achieve a fast response speed.

An arm layer 171 that is electrically connected to the semiconductor layer 170 is formed at a side of the semiconductor layer 170 on the boundary of the semiconductor layer 170. The arm layer 171 may correspond to the reference numeral 18 in FIGS. 1A to 1D, and FIGS. 2A to 2C. The arm layer 171 may be a material layer that is formed to reliably manufacture the memory cell CE, as will be described later. The arm layer 171 may be formed at the same layer level as the semiconductor layer 170.

The arm layer 171 may be an arm pattern that is electrically connected to a part of the semiconductor layer 170. In some embodiments, the arm layer 171 may include the same material as the semiconductor layer 170. For example, the arm layer 171 may include a polysilicon layer or a single-crystalline layer. In some embodiments, the arm layer 171 may include a different material from the semiconductor layer 170, e.g., a conductive layer.

A barrier metal layer 178 may optionally be disposed between the semiconductor layer 170 and the third interlayer insulating layer 146. In some example embodiments, the barrier metal layer 178 may include titanium, tantalum, titanium nitride, or tantalum nitride. The barrier metal layer 178 forms an ohmic contact with the semiconductor layer 170 in order to reduce resistance between first and second embedded contacts 182 and 184 formed under the barrier metal layer 178 and the semiconductor layer 170. However, in a case where the barrier metal layer 178 is unnecessary according to a kind/type of a metal material used to form the first and second embedded contacts 182 and 184 and a doping concentration of the semiconductor layer 170, the barrier metal layer 178 may not be formed (i.e., may be omitted).

The first embedded contact 182 may be formed between the barrier metal layer 178 under the common source region 172 and the dummy wiring structure 160. Accordingly, the common source region 172 may be electrically connected to the dummy gate structure 130 via the first embedded contact 182 and the dummy wiring structure 160. The first embedded contact 182 may include metal such as tungsten, molybdenum, titanium, cobalt, tantalum, and nickel, and a metal material such as tungsten silicide, titanium silicide, cobalt silicide, tantalum silicide, and nickel silicide.

The first embedded contact 182 electrically connects the common source region 172 to the dummy gate structure 130 on the substrate 110 so as to reduce/prevent wrong operations of the vertical type memory devices. In general, if wiring lines connected to the common source region 172 are formed on the memory cell, an area for forming another wiring line may be reduced due to a limited area on the memory cell. However, when the common source region 172 is connected to the dummy gate structure 130 on the substrate 110 via the first embedded contact 182, a plurality of first embedded contacts 182 may be formed without limitation in the forming area due to the other wiring lines, and wrong operations of the semiconductor chip 1000 may be effectively reduced/prevented.

The second embedded contact 184 may be formed between the barrier metal layer 178 and the dummy wiring structure 160 under the p+ well 174. Accordingly, the p+ well 174 may be electrically connected to the dummy gate structure 130 via the second embedded contact 184 and the dummy wiring structure 160. When the p+ well 174 is electrically connected to the dummy gate structure 130 on the substrate 110, wrong operations of the semiconductor chip 1000 may be reduced/prevented.

A first insulating layer 191, a ground selection line 192, a second insulating layer 193, a first word line 194, a third insulating layer 195, a second word line 196, a fourth insulating layer 197, a string selection line 198, and a fifth insulating layer 199 may be sequentially formed on the semiconductor layer 170.

In some example embodiments, the ground selection line 192, the first and second word lines 194 and 196, and the string selection line 198 may include metal such as tungsten, nickel, cobalt, and tantalum, polysilicon doped with impurities, metal silicide such as tungsten silicide, nickel silicide, cobalt silicide, and tantalum silicide, or a combination thereof. The first to fifth insulating layers 191, 193, 195, 197, and 199 may include silicon oxide, silicon nitride, or silicon oxynitride.

In addition, in FIGS. 3A to 3D, two word lines are briefly shown, but 4, 8, 16, 32, or 64 word lines may be vertically stacked between the ground selection line 192 and the string selection line 198 and the insulating layer is respectively disposed between two adjacent word lines. In addition, the number of stacked word lines is not limited thereto. Also, two or more ground selection lines 192 and two or more string selection lines 198 may be vertically stacked, respectively.

In some embodiments, at least one dummy word line may be formed between the ground selection line 192 and the first word line 194 and/or between the second word line 196 and the string selection line 198. The dummy word line may reduce/prevent interference of cells between the lowermost word line (first word line) 194 and the ground selection line 192 and/or between the uppermost word line (second word line) 196 and the string selection line 198, wherein the cell interference may occur when intervals between the memory cells in the vertical direction (e.g., intervals between the above lines) is reduced.

Channel layers 200 may pass through the ground selection line 192, the first and second word lines 194 and 196, the string selection line 198, and the first to fifth insulating layers 191, 193, 195, 197, and 199 to extend in a third direction (z-axis direction of FIG. 3B) that is perpendicular to the upper surface of the substrate 110. A bottom surface of each channel layer 200 may contact an upper surface of the semiconductor layer 170. The channel layers 200 may be spaced apart from one another along the first direction and the second direction.

In some example embodiments, the channel layer 200 may include polysilicon doped with impurities, or polysilicon not doped with impurities. The channel layer 200 may have a cup shape extending in a vertical direction (or cylinder shape with closed bottom), and an embedded insulating layer 202 may be filled on an inner side wall of the channel layer 200. An upper surface of the embedded insulating layer 202 may be located at the same layer level as that of an upper surface of the channel layer 200. Otherwise, the channel layer 200 may be formed as a pillar, and in this case, the embedded insulating layer 202 may not be formed (i.e., may be omitted).

A gate insulating layer 204 may be disposed between the channel layer 200 and the ground selection line 192, the first and second word lines 194 and 196, and the string selection line 198. The gate insulating layer 204 may include a tunnel insulating layer 204a (see FIG. 9), a charge storage layer 204b (see FIG. 9), and a blocking insulating layer 204c (see FIG. 9) that are sequentially stacked. Selectively, a barrier metal layer may be further formed between the gate insulating layer 204 and the ground selection line 192, the first and second word lines 194 and 196, and the string selection line 198.

The tunnel insulating layer 204a may include silicon oxide, hafnium oxide, aluminium oxide, zirconium oxide, and tantalum oxide. The charge storage layer 204b may store electrons tunneled from the channel layer 200, and may include silicon nitride, boron nitride, silicon boron nitride, or polysilicon doped with impurities. The blocking insulating layer 204c may include a single-layer or stacked layers, each including silicon oxide, silicon nitride, hafnium oxide, aluminium oxide, zirconium oxide, and tantalum oxide. However, materials included in the blocking insulating layer 204c are not limited to the above examples, and the blocking insulating layer 204c may include a dielectric material having high dielectric constant.

The ground selection line 192, a part of the channel layer 200 adjacent to the ground selection line 192, and a part of the gate insulating layer 204 adjacent to the ground selection line 192 may configure/provide a ground selection transistor. In addition, the first and second word lines 194 and 196 and a part of the channel layer 200 and a part of the gate insulating layer 204, which are adjacent to the first and second word lines 194 and 196, may configure/provide a cell transistor. The string selection line 198 and a part of the channel layer 200 and a part of the gate insulating layer 204, which are adjacent to the string selection line 198, may configure a string selection transistor. The cell region I may include the ground selection transistor, the cell transistors, and the string selection transistor in order to configure/provide a memory cell.

A drain region 206 may be formed on the channel layer 200 and the embedded insulating layer 202. In some example embodiments, the drain region 206 may include polysilicon doped with impurities. A second etch-stop layer 210 may be formed on the fifth insulating layer 199 and on a side wall of the drain region 206. An upper surface of the second etch-stop layer 210 may be formed at the same layer level as an upper surface of the drain region 206. The second etch-stop layer 210 may include an insulating material such as silicon nitride and silicon oxide.

A fourth interlayer insulating layer 212 may be formed on the second etch-stop layer 210. The fourth interlayer insulating layer 212 may cover exposed side surfaces of the string selection line 198, the first and second word lines 194 and 196, and the ground selection line 192. An upper surface of the fourth interlayer insulating layer 212 may be formed at the same layer level as the upper surface of the drain region 206.

A bit line contact 214 that penetrates through the fourth interlayer insulating layer 212 to be connected to the drain region 206 is formed, and a bit line 216 may be formed on the bit line contact 214. The bit line 216 may extend along the second direction, and the plurality of channel layers 200 arranged along the second direction may be electrically connected to the bit line 216. A fifth interlayer insulating layer 218 covering the bit line 216 may be formed on the fourth interlayer insulating layer 212.

A common source line 222 extending in the first direction may be formed on the common source region 172. A common source line spacer 224 including an insulating material may be formed on opposite side walls of the common source line 222 so as to protect/prevent the common source line 222 from being electrically connected to the ground selection line 192, the first and second word lines 194 and 196, and the string selection line 198. An upper surface of the common source line 222 may be formed at the same layer level as the upper surface of the second etch-stop layer 210.

A peripheral circuit wiring structure 230 may include a vertical contact 232, a dummy bit line 234, an upper wiring layer 236, a third wire contact 238, and a dummy bit line contact 242. The peripheral circuit wiring structure 230 may be disposed in the cell region I, and may penetrate through the ground selection line 192, the first and second word lines 194 and 196, the string selection line 198, and the semiconductor layer 170 to be electrically connected to the peripheral circuit gate structure 120.

The vertical contact 232 may penetrate through the fourth interlayer insulating layer 212, the second etch-stop layer 210, the string selection line 198, the first and second word lines 194 and 196, the ground selection line 192, the semiconductor layer 170, and the barrier metal layer 178 to be connected to the lower wiring structure 150. A bottom surface of the vertical contact 232 may contact an upper surface of the second lower wiring layer 158.

In some example embodiments, the vertical contact 232 may include a conductive material such as tungsten, nickel, tantalum, cobalt, aluminium, copper, tungsten silicide, nickel silicide, tantalum silicide, cobalt silicide, and polysilicon doped with impurities. A horizontal cross-section of the vertical contact 232 may have a circular shape, an oval shape, a rectangular shape, or a square shape, but is not limited thereto.

A vertical contact spacer 240 including an insulating material is formed on a side wall of the vertical contact 232 so as to protect/prevent the vertical contact 232 from being electrically connected to the string selection line 198, the first and second word lines 194 and 196, the ground selection line 192, and the semiconductor layer 170. The dummy bit line contact 242 may be formed on the vertical contact 232. The dummy bit line contact 242 may be formed at the same layer level as the bit line contact 214.

The dummy bit line 234 may be formed on the dummy bit line contact 242 and the fourth interlayer insulating layer 212. The dummy bit line 234 may be spaced apart a predetermined distance from the bit line 216 to extend in the y-axis direction. An upper surface of the dummy bit line 234 may be formed at the same layer level as that of the upper surface of the bit line 216. The channel layer 200 may not be arranged under the dummy bit line 234. The dummy bit line 234 may be formed in a part of the cell region I, under which the first peripheral circuit region II is formed (that is, a location where the cell region I and the first peripheral circuit region II overlap), and electrically connects the peripheral circuit gate structure 120 to the upper wiring layer 236.

The upper wiring layer 236 is formed on the fifth interlayer insulating layer 218, and may be connected to the dummy bit line 234 via the third wire contact 238. The upper wiring layer 236 may include metal such as aluminium (Al), copper (Cu), silver (Ag), and gold (Au). Since the upper wiring layer 236 is electrically connected to the peripheral circuit gate structure 120 via the vertical contact 232 that penetrates through the cell region I, a distance between the upper wiring layer 236 and the peripheral circuit gate structure 120 may be reduced.

Therefore, line resistance between the peripheral circuit gate structure 120 and the memory cells may be reduced, and accordingly, reduction in a cell current may be reduced and electric characteristics of the semiconductor chip 1000 may be improved. Also, since the cell region I and the first peripheral circuit region II are arranged so as to overlap each other in a direction perpendicular to the substrate 110, an area of the cell region I on the substrate 110 may be effectively increased, and a degree of integration of the semiconductor chip 1000 may be improved.

In addition, as wiring lines connected to the common source region 172 and the p+ well 174 are disposed under the cell region I via the first and second embedded contacts 182 and 184, the wiring lines may not be formed on the cell region I. Accordingly, an area for forming the upper wiring layer 236 may be ensured/provided, and the electric characteristics of the semiconductor chip 1000 may be improved.

The peripheral circuit gate structure 120 may be formed in the second peripheral circuit region III of the substrate 110. A lower wiring structure that penetrates through the first etch-stop layer 140, and the first to third interlayer insulating layers 142, 144, and 146 may be formed on the peripheral circuit gate structure 120. A fourth wire contact (peripheral circuit contact) 243 may penetrate through a fourth interlayer insulating layer 212 to be connected to the lower wiring structure 150. A peripheral circuit wire 244 may be formed on the fourth wire contact 243 and the fourth interlayer insulating layer 212. The peripheral circuit gate structure 120 formed on the second peripheral circuit region III may supply electric signals to the memory cells via the fourth wire contact 243 and the peripheral circuit wire 244 formed outside the cell region I.

A ground selection line contact GSLC, first and second word line contacts WLC1 and WLC2, and string selection line contact SSLC may be arranged in the fourth interlayer insulating layer 212 on the pad region IV. The ground selection line contact GSLC, the first and second word line contacts WLC1 and WLC2, and the string selection line contact SSLC penetrate through the second etch-stop layer 210 to be respectively connected to the ground selection line 192, the first and second word lines 194 and 196, and the string selection line 198. Upper surfaces of the ground selection line contact GSLC, the first and second word line contacts WLC1 and WLC2, and the string selection line contact SSLC may be formed at the same layer level as one another.

A ground selection line pad GSLP, word line pads WLP1 and WLP2, and string selection line pad SSLP that are electrically connected respectively to the ground selection line contact GSLC, the first and second word line contacts WLC1 and WLC2, and the string selection line contact SSLC are formed on the fourth interlayer insulating layer 212. In some embodiments, the ground selection line pad GSLP, the word line pads WLP1 and WLP2, and the string selection line pad SSLP are electrically connected to an upper wiring structure.

Figure 4A:
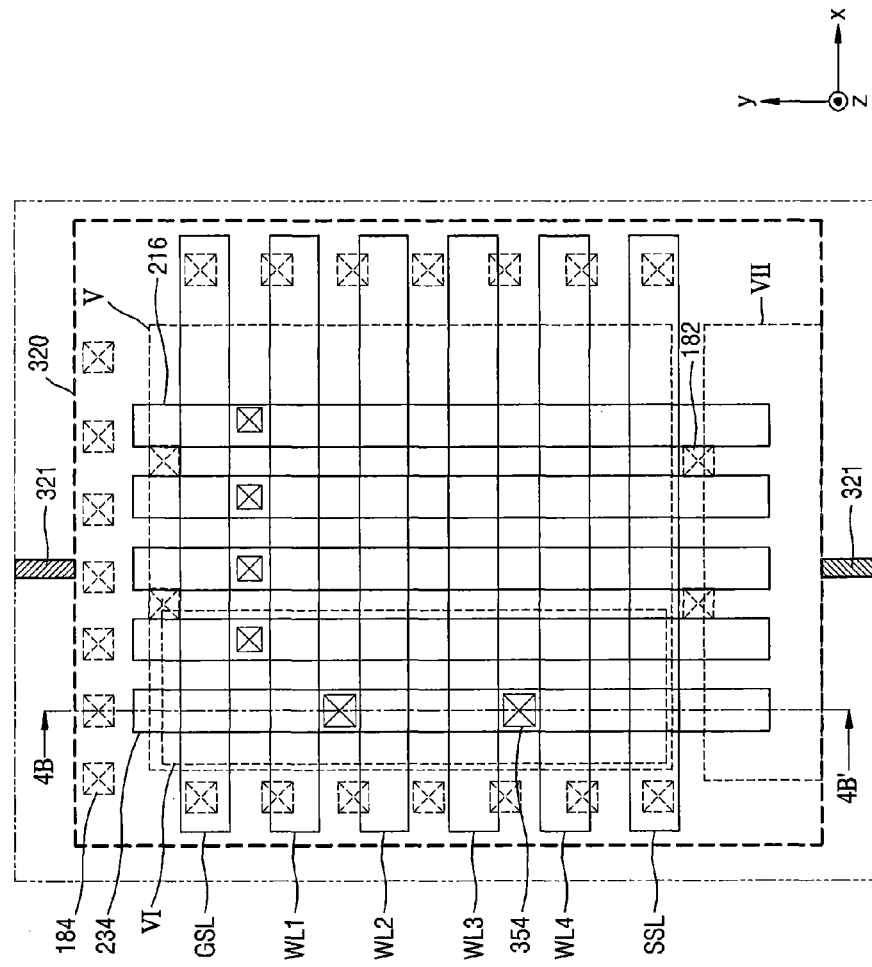
FIGS. 4A and 4B are diagrams of a semiconductor chip according to some embodiments.
Figure 4B:
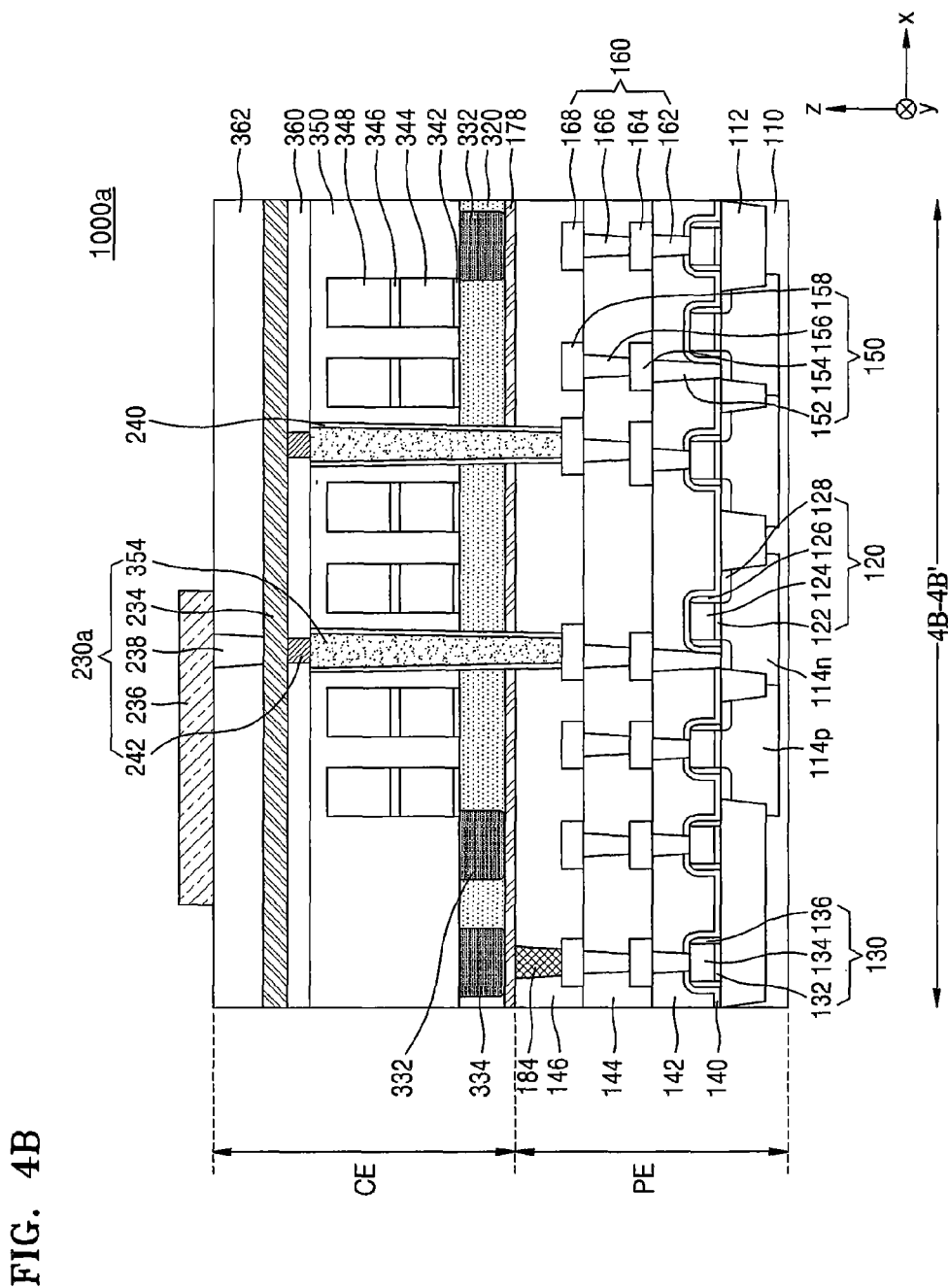

FIGS. 4A and 4B are diagrams of a semiconductor chip 1000a according to some embodiments.

In more detail, FIG. 4A is a layout of the semiconductor chip 1000a according to some embodiments, and FIG. 4B is a cross-sectional view of the semiconductor chip 1000a taken along a line 4B-4B' of FIG. 4A. The semiconductor chip 1000a is similar to the semiconductor chip 1000 of FIGS. 3A to 3D, except that a horizontal type (or flat plate type) memory cell is formed and a location of an arm layer 321 is different from that of the semiconductor chip 1000.

Accordingly, differences of FIGS. 4A and 4B will be described below, compared to the semiconductor chip 1000 of FIGS. 3A to 3D. In FIGS. 4A and 4B, like reference numerals denote the same elements. The semiconductor chip 1000a may correspond to the semiconductor chip 12 of FIGS. 1A-2C.

Referring to FIGS. 4A and 4B, the substrate 110 may include a cell region V, a first peripheral circuit region VI, and a second peripheral circuit region VII. The cell region V may include horizontal memory cells.

The semiconductor chip 1000a may include a semiconductor layer 320. The semiconductor layer 320 may correspond to the reference numeral 170 of FIGS. 3A to 3D. The semiconductor layer 320 may have overlap with the cell region V, the first peripheral circuit region VI, and the second peripheral circuit region VII.

A plurality of device isolation trenches spaced apart from one another in the first direction and extending in the second direction are formed on the semiconductor layer 320 so as to define active areas in the semiconductor layer 320. Common source regions 332 extending in the first direction may be formed in the semiconductor layer 320, and a p+ well 334 may be formed in an outer portion of the semiconductor layer 320 to be spaced apart from the common source region 332.

An arm layer 321 that is electrically connected to the semiconductor layer 320 is formed at a side of the semiconductor layer 320 around the semiconductor layer 320, e.g., upper and lower portions of the semiconductor layer 320. The arm layer 321 may correspond to the reference numeral 171 of FIGS. 3A to 3D. As will be described later, the arm layer 321 may be a material layer that is formed to manufacture the memory cells CE reliably.

The arm layer 321 is formed at the same layer level as that of the semiconductor layer 320. The arm layer 321 may be an arm pattern electrically connected to a part of the semiconductor layer 320. In some embodiments, the arm layer 321 may include the same material as that of the semiconductor layer 320. For example, the arm layer 321 may include a polysilicon layer or a single crystalline silicon layer. Otherwise, the arm layer 321 may include a different material from that of the semiconductor layer 320, e.g., a conductive layer.

A plurality of tunnel insulating layer patterns 342 may be arranged on the semiconductor layer 320 to be spaced apart from one another along the first direction and the second direction. A plurality of charge storage layer patterns 344 may be formed on the plurality of tunnel insulating layer patterns 342. Accordingly, the plurality of charge storage layer patterns 344 may be spaced apart from one another along the first direction and the second direction, as well. A plurality of blocking insulating layer patterns 346 that extend in the first direction and are spaced apart from one another in the second direction may be formed on the plurality of charge storage layer patterns 344.

A plurality of gate electrode layers 348 may be formed on the plurality of blocking insulating layer patterns 346. Each of the plurality of gate electrode layers 348 extends in the first direction, and the plurality of gate electrode layers 348 may be spaced apart from one another in the second direction. The plurality of gate electrode layers 348 arranged sequentially along the second direction may include a ground selection line GSL, first to fourth word lines WL1, WL2, WL3, and WL4, and a string selection line SSL.

A first insulating layer 350 covering the plurality of gate electrode layers 348 may be formed on the semiconductor layer 320. In addition, in some embodiments, an air-gap may be generated in the first insulating layer 350 between the two adjacent gate electrode layers 348.

A peripheral circuit wiring structure 230a may include a vertical contact 354, a dummy bit line 234, an upper wiring layer 236, a third wiring contact 238, and a dummy bit line contact 242. The vertical contact 354 penetrates through the first insulating layer 350, the semiconductor layer 320, the barrier metal layer 178, and the third interlayer insulating layer 146 between the first and second word lines WL1 and WL2 to be connected to the lower wiring structure 150.

A second insulating layer 360 is formed on the first insulating layer 350 and the vertical contact 354, and the dummy bit line 234 that is connected to the vertical contact 354 may be formed in the second insulating layer 360. The dummy bit line 234 and a bit line 216 are formed on the second insulating layer 360, and a third insulating layer 362 covering the dummy bit line 234 and the bit line 216 may be formed on the second insulating layer 360. An upper wiring layer 236 formed on the third insulating layer 362 may be connected to the dummy bit line 234 via the third wire contact 238.

Figure 15A:
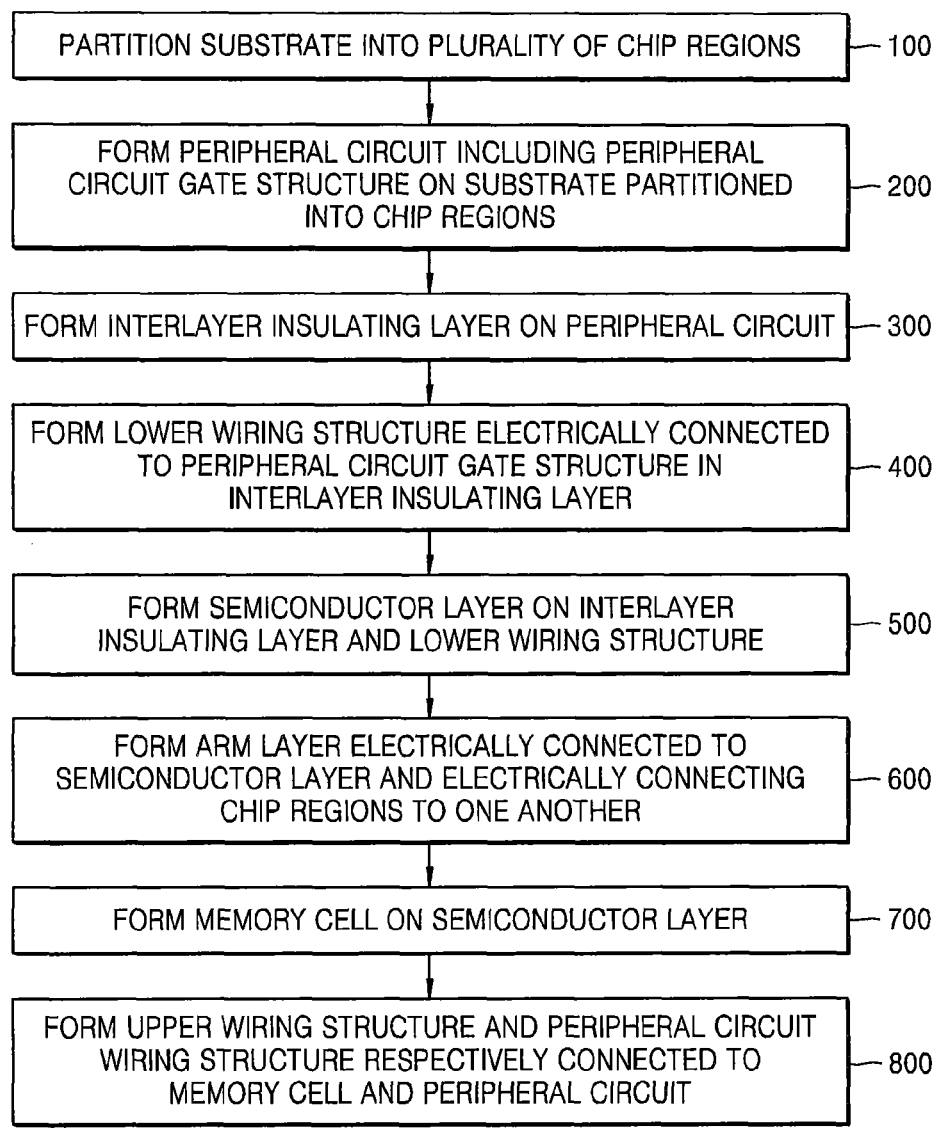
FIGS. 15A to 15C are flowcharts of methods of manufacturing a semiconductor chip, according to some embodiments.
Figure 15B:
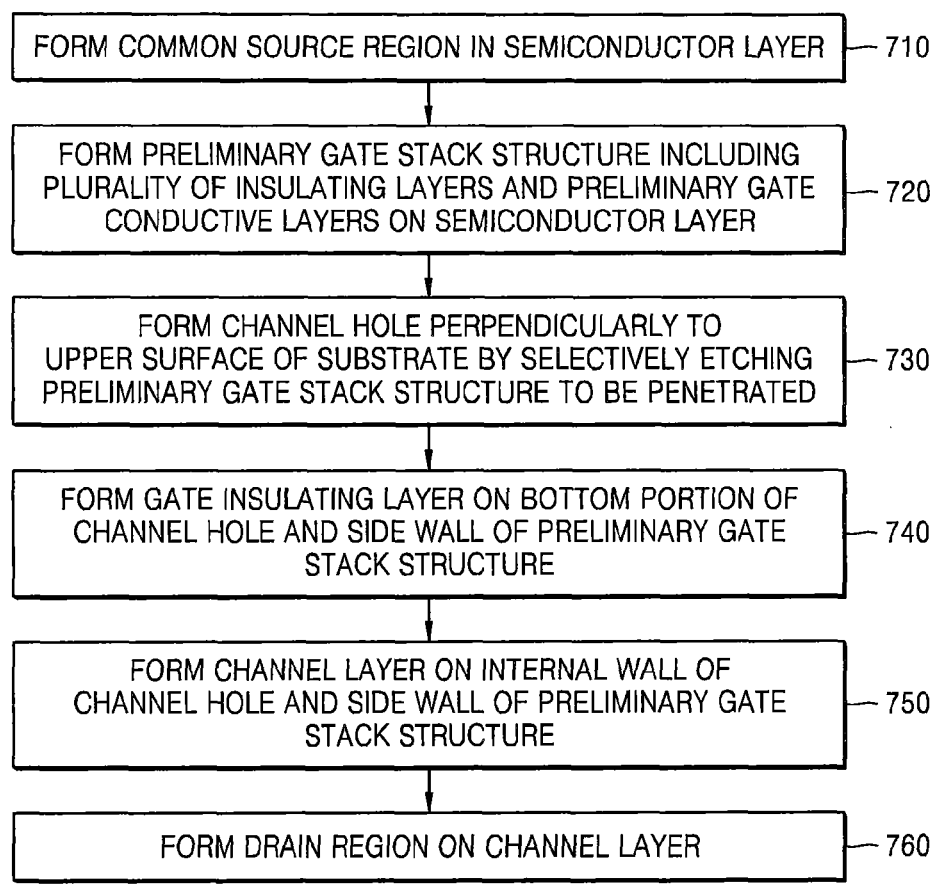
Figure 15C:
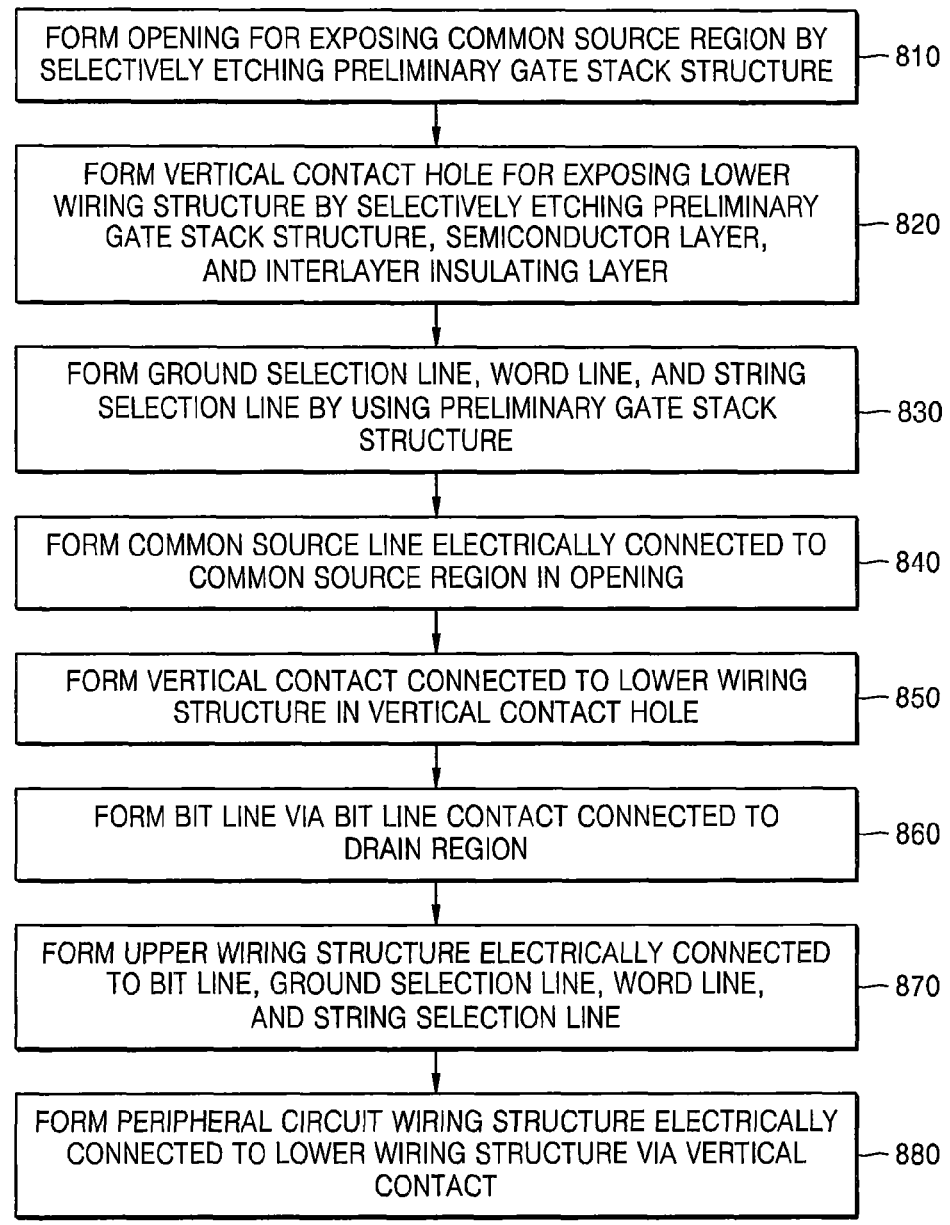

FIGS. 5A to 14 are cross-sectional views of methods of manufacturing a semiconductor chip according to some example embodiments, and FIGS. 15A to 15C are flowcharts illustrating methods of manufacturing a semiconductor chip according to some example embodiments.

In detail, FIGS. 5A to 14 may illustrate methods of manufacturing the semiconductor chip 1000 described above with reference to FIGS. 3A to 3D. FIGS. 5A, 6A, 7A, 8, 9, 10A, 11, 12A, 13A, and 14 are cross-sectional views of the semiconductor chip 1000 taken along a line 3B-3B' of FIG. 3A, and FIGS. 5B, 6B, 7B, 10B, 12B, and 13B are cross-sectional views of the semiconductor chip 1000 taken along a line 3C-3C' of FIG. 3A.

In the peripheral circuit gate structure 120 shown in FIGS. 5B, 6B, 7B, 10B, 12B, and 13B, the channel region (channel layer) between the source and drain regions 128 is shown to be formed along the second direction (y-axis direction of FIG. 4B) for convenience of description, but the channel region (channel layer) may be formed along the first direction (x-direction). FIGS. 15A to 15C are flowcharts illustrating the method of manufacturing a semiconductor chip, and an order of manufacturing processes may be changed, if necessary.

Figure 5A:
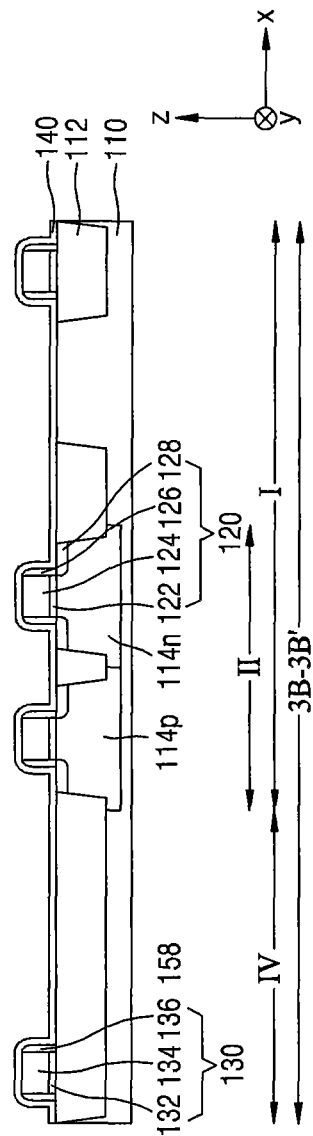
FIGS. 5A to 14 are cross-sectional views of methods of manufacturing a semiconductor chip, according to some embodiments.
Figure 5B:
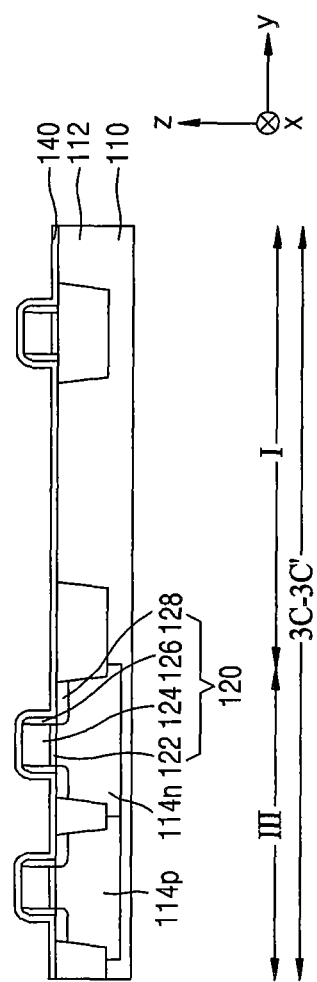

FIGS. 5A, 5B, and 15A, the substrate 110 is partitioned into a plurality of chip regions (100). Partitioning of the chip regions is shown in FIG. 1C. After forming a buffer oxide layer and a silicon nitride layer on the substrate 110, the silicon nitride layer, the buffer oxide layer, and the substrate 110 are continuously patterned to form a buffer oxide layer pattern, a silicon nitride layer pattern, and trenches. By embedding an insulating material such as silicon oxide in the trench, the device isolation layer 112 may be formed. The device isolation layer 112 is planarized until an upper surface of the silicon nitride layer pattern is exposed, and after that, the silicon nitride layer pattern and the buffer oxide layer pattern may be removed.

A peripheral circuit including a peripheral circuit gate structure is formed on the substrate 110 that has been partitioned into the chip regions as follows (200). After forming a sacrificial oxide layer on the substrate 110, the sacrificial oxide layer is patterned by using a photoresist and a first ion implantation process is performed to form a peripheral circuit p well 114p on the substrate 110. In addition, a patterning process using the photoresist and a second ion implantation process are performed to form a peripheral circuit n-well 114n on the substrate 110. The peripheral circuit p-well 114p may be an area for forming an NMOS transistor, and the peripheral circuit n-well 114n may be an area for forming a PMOS transistor.

The peripheral circuit gate insulating layer 122 may be formed on the substrate 110. The peripheral circuit gate insulating layer 122 may include a first gate insulating layer and a second gate insulating layer that are sequentially stacked. The first and second gate insulating layers may be a low voltage gate insulating layer and a high voltage gate insulating layer, respectively.

A peripheral circuit gate conductive layer is formed on the peripheral circuit gate insulating layer 122, and is patterned to form the peripheral circuit gate electrode layer 124. The peripheral circuit gate electrode layer 124 may include doped polysilicon. In addition, the peripheral circuit gate electrode layer 124 may be formed to have a multi-layered structure including a polysilicon layer and a metal layer, or a multi-layered structure including a polysilicon layer and a metal silicide layer.

The peripheral circuit spacer 126 may be formed on side walls of the peripheral circuit gate electrode layer 124. For example, the peripheral circuit spacer 126 may be formed by forming a silicon nitride layer on the peripheral circuit gate electrode layer 124 and performing an anisotropic etching process on the silicon nitride layer. The source and drain regions 128 may be formed in the substrate 110 at opposite sides of the peripheral circuit gate electrode layer 124. In a case of the NMOS transistor, the source and drain regions 128 may be doped with n-type impurities, and in a case of the PMOS transistor, the source and drain regions 128 may be doped with the p-type impurities. The source and drain regions 128 may have a lightly doped drain (LDD) structure.

Accordingly, the peripheral circuit gate structure 120 including the peripheral circuit gate insulating layer 122, the peripheral circuit gate electrode layer 124, and the peripheral circuit spacer 126, and the source and drain regions 128 may be obtained. The first etch-stop layer 140 may be formed on the peripheral circuit gate structure 120. The first etch-stop layer 140 may include an insulating material, e.g., silicon oxide, silicon oxynitride, or silicon oxide.

In addition, the dummy gate structure 130 may be formed on the device isolation layer 112, that is, a field region. The dummy gate structure 130 may be formed on an edge of the substrate 110, or on a portion of the substrate 110, on which a memory cell is to be disposed in a post-process.

Figure 6A:
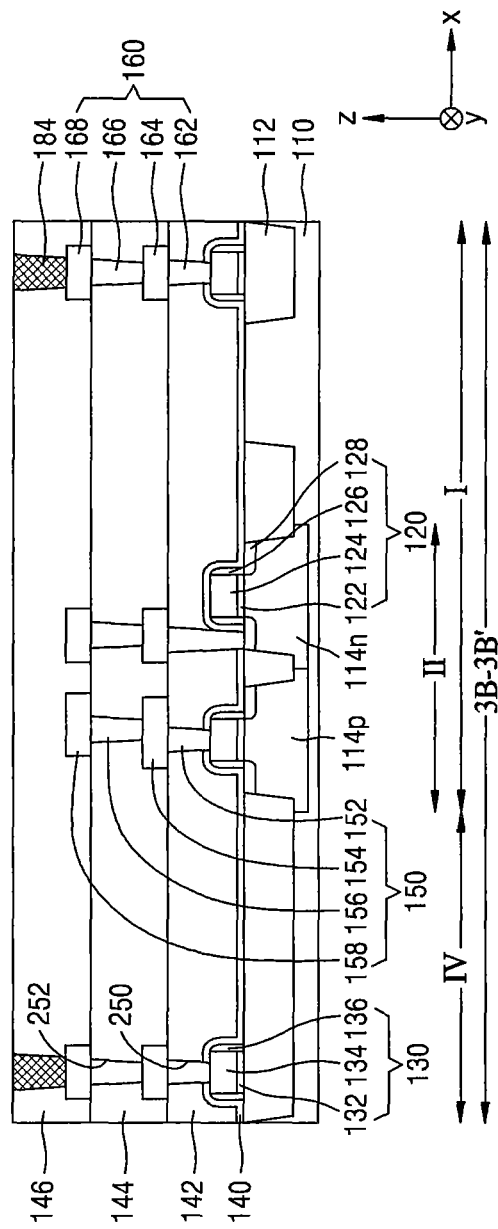
Figure 6B:
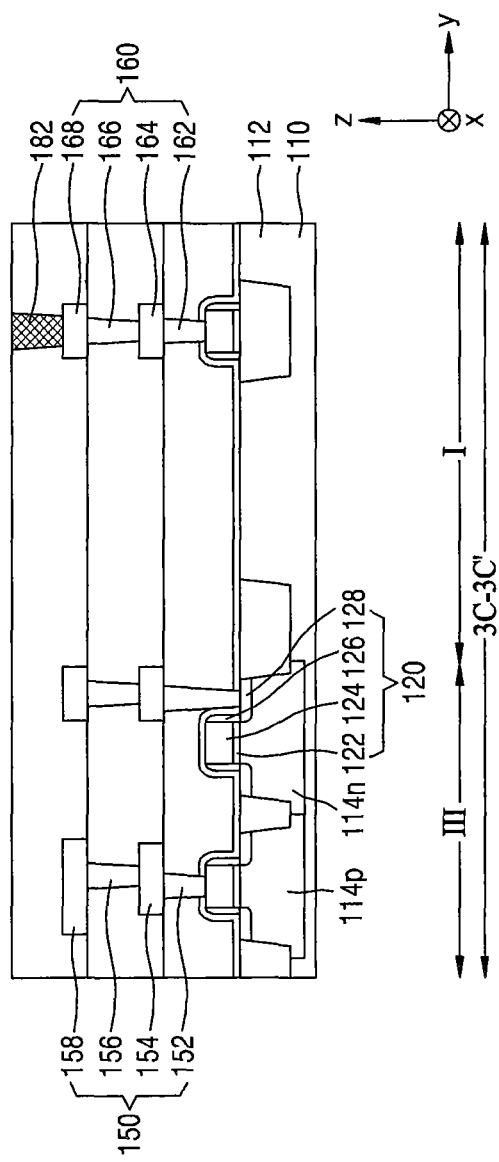
Figure 7A:
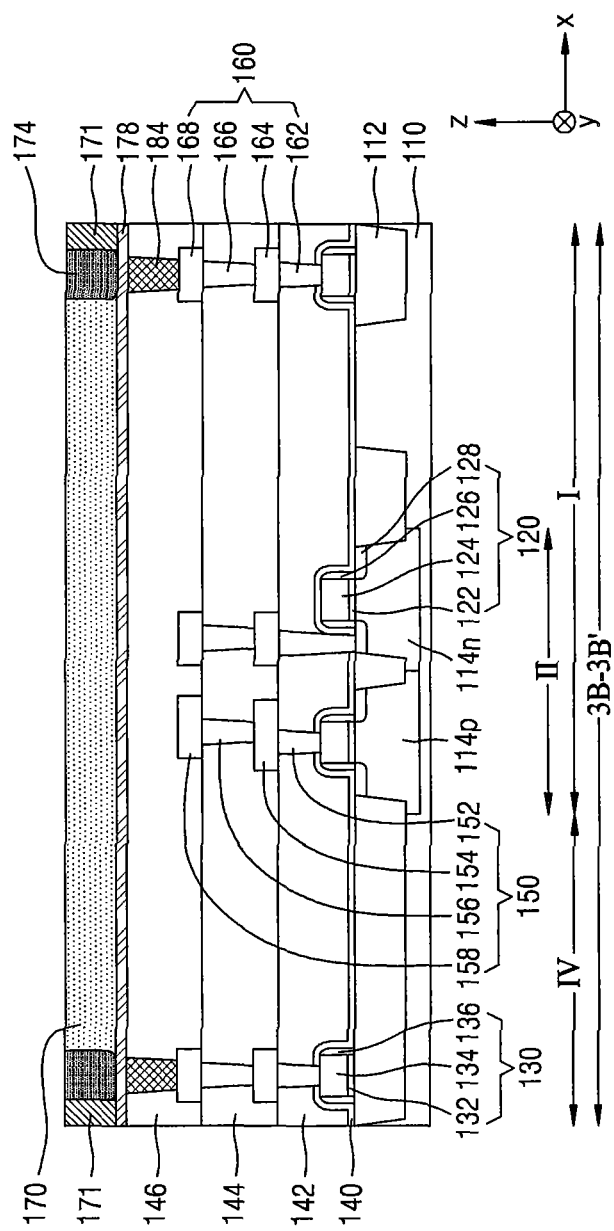
Figure 7B:
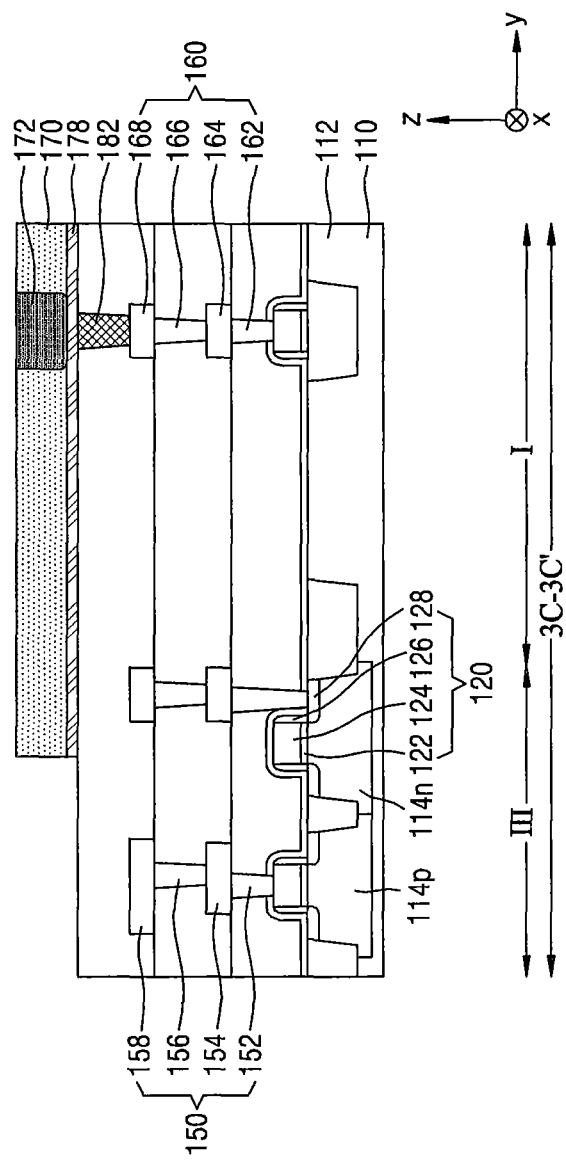

Referring to FIGS. 6A, 6B, and 15A, the interlayer insulating layers 142, 144, and 146 are formed on the peripheral circuit (300). The lower wiring structure 150 that is electrically connected to the peripheral circuit gate structure 120 is formed in the interlayer insulating layers 142, 144, and 146 (400). This will be described below.

First, the first interlayer insulating layer 142 may be formed on the first etch-stop layer 140. After that, the first wire contact hole 250 penetrating through the first interlayer insulating layer 142 and the first etch-stop layer 140 may be formed. The first wire contact hole 250 may be formed to expose an upper portion of the peripheral circuit gate electrode layer 124 or upper portions of the source and drain regions 128. After that, a conductive material is embedded in the first wire contact hole 250, and the conductive material is planarized until an upper surface of the first interlayer insulating layer 142 is exposed so as to form the first wire contact 152 in the first wire contact hole 250.

A conductive layer is formed on the first interlayer insulating layer 142, and then, the conductive layer is patterned to form the first lower wiring layer 154 that is electrically connected to the first wire contact 152. The second interlayer insulating layer 144 may be formed on the first lower wiring layer 154 and the first interlayer insulating layer 142. The second wire contact hole 252 that penetrates through the second interlayer insulating layer 144 may be formed to expose an upper surface of the first lower wiring layer 154. After that, a conductive material is embedded in the second wire contact hole 252, and the conductive material is planarized until an upper surface of the second interlayer insulating layer 144 is exposed so as to form the second wire contact 156 in the second wire contact hole 252.

After forming a conductive layer on the second interlayer insulating layer 144, the conductive layer is patterned to form the second lower wiring layer 158 that is electrically connected to the second wire contact 156. The third interlayer insulating layer 146 may be formed on the second lower wiring layer 158 and the second interlayer insulating layer 144.

In some example embodiments, the first to third interlayer insulating layers 142, 144, and 146 may include an insulating material such as silicon oxide, silicon nitride, or silicon oxynitride. The first and second lower wiring layers 154 and 158 and the first and second wire contacts 152 and 156 may include a conductive material such as metal, e.g., tungsten, molybdenum, titanium, cobalt, tantalum, and nickel, tungsten silicide, titanium silicide, cobalt silicide, tantalum silicide, or nickel silicide. The lower wiring structure 150 may be formed through the above described processes.

In addition, the first and second dummy wire contacts 162 and 166 and the first and second dummy wiring layers 164 and 168 may be formed on the dummy gate structure 130 through processes that are similar to the processes of forming the lower wiring layers 154 and 158 and the wire contacts 152 and 156. Accordingly, the dummy wiring structure 160 may be obtained.

First and second embedded contact holes that expose an upper surface of the second dummy wiring layer 168 are formed in the third interlayer insulating layer 146, and are embedded with a conductive material and fill the third interlayer insulating layer 146 so as to form the first and second embedded contacts 182 and 184 contacting the second dummy wiring layer 168.

Referring to FIGS. 7A, 7B, 15A, and 15B, the barrier metal layer 178 is formed on the third interlayer insulating layer 146 and the first and second embedded contacts 182 and 184. For example, the barrier metal layer 178 may include a material such as titanium, tantalum, or titanium nitride.

The semiconductor layer 170 is formed on the barrier metal layer 178 (500). If the barrier metal layer 178 is not formed, the semiconductor layer 170 is formed directly on the interlayer insulating layer and the lower wiring structure. The arm layer 171 that is electrically connected to the semiconductor layer 170 and electrically connects chip regions to each other is formed (600).

In some example embodiments, the semiconductor layer 170 may be formed by a chemical vapour deposition (CVD) process, an atomic layer deposition (ALD) process, or a physical vapour deposition (PVD) process using polysilicon doped with first impurities. The semiconductor layer 170 may be formed to a thickness of about 20 nm to about 500 nm, but is not limited thereto. During forming the semiconductor layer 170, the first impurities may be in-situ doped on the semiconductor layer 170, or after forming the semiconductor layer 170, the first impurities may be doped on the semiconductor layer 170 through an ion implantation process. The first impurities may be p-type impurities.

In some example embodiments, the arm layer 171 may be formed by forming the semiconductor layer 170 by the above deposition process and patterning the semiconductor layer 170. Accordingly, the arm layer 171 may include the same material as that of the semiconductor layer 170. For example, the arm layer 171 may include polysilicon doped with impurities. In some example embodiments, the arm layer 171 may include single crystalline silicon.

In some example embodiments, the arm layer 171 may include a different material from that of the semiconductor layer 170. For example, after forming the semiconductor layer 170, the arm layer 171 may be formed by forming a conductive layer (or conductive pattern) electrically connected to the semiconductor layer 170. The arm layer 171 may be a material layer that is formed to reliably manufacture the memory cells CE.

Next, memory cells are formed on the semiconductor layer 170 (700). The semiconductor layer 170 is doped with second impurities by using a first ion implantation mask so as to form the common source region 172 in the semiconductor layer 170 (710). The second impurities may be n-type impurities. The common source region 172 may extend in the first direction, and the first embedded contact 182 may be located under the common source region 172. After that, the first ion implantation mask may be removed.

Third impurities are doped on an edge portion of the semiconductor layer 170 by using a second ion implantation mask to form the p+ wells 174 in the semiconductor layer 170. The third impurities may be p-type impurities. A plurality of p+ wells 174 may be spaced apart from one another in the second direction, and the second embedded contact 184 may be located under at least one of the plurality of p+ wells 174. After that, the second ion implantation mask may be removed.

Figure 8:
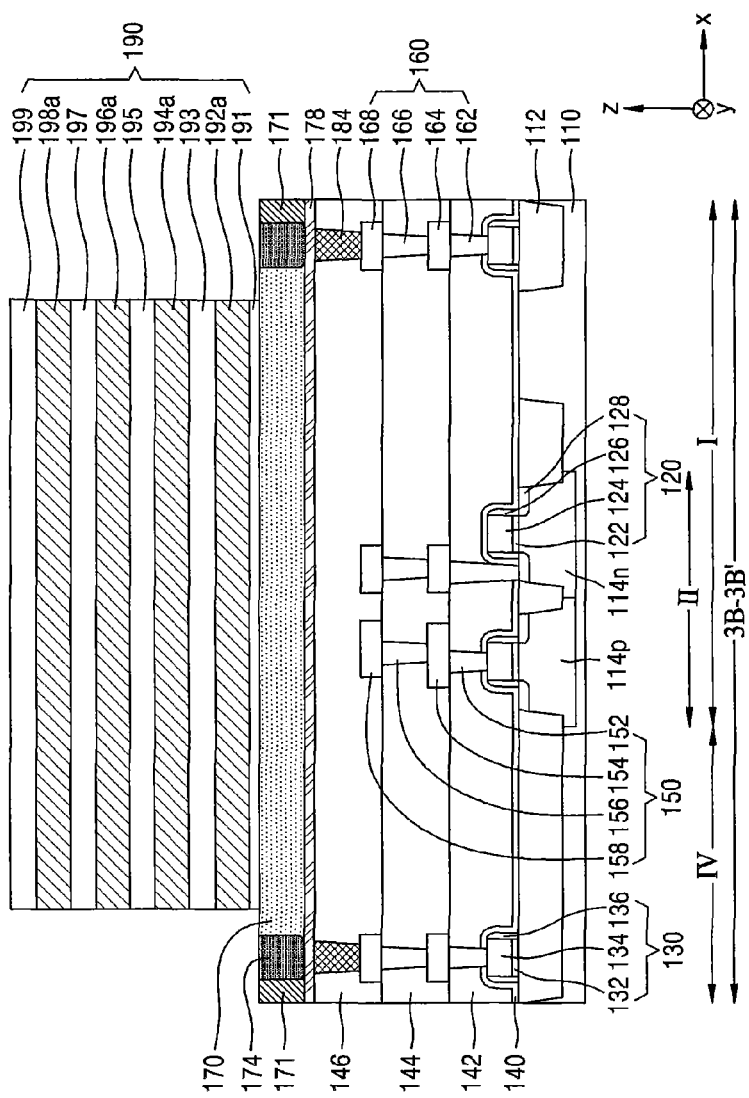

Referring to FIGS. 8 and 15B, a preliminary gate stack structure 190 in which first to fifth insulating layers 191, 193, 195, 197, and 199 and first to fourth preliminary gate conductive layers 192a, 194a, 196a, and 198a are alternately stacked may be formed on the semiconductor layer 170 (720).

For example, the first to fifth insulating layers 191, 193, 195, 197, and 199 may be formed to a predetermined thickness by using silicon oxide, silicon nitride, or silicon oxynitride. In addition, the first to fourth preliminary gate conductive layers 192a, 194a, 196a, and 198a may be formed to a predetermined thickness by using silicon nitride, silicon carbide, or polysilicon. Each of the first to fourth preliminary gate conductive layers 192a, 194a, 196a, and 198a may be a preliminary layer or a sacrificial layer for forming the ground selection line 192 (see FIG. 12A), a plurality of word lines 194 and 196 (see FIG. 12A), and the string selection line 198 (see FIG. 12A). The number of the first to fourth preliminary gate conductive layers 192a, 194a, 196a, and 198a may be appropriately selected according to the number of the ground selection line, the word lines, and the string selection line.

Figure 9:
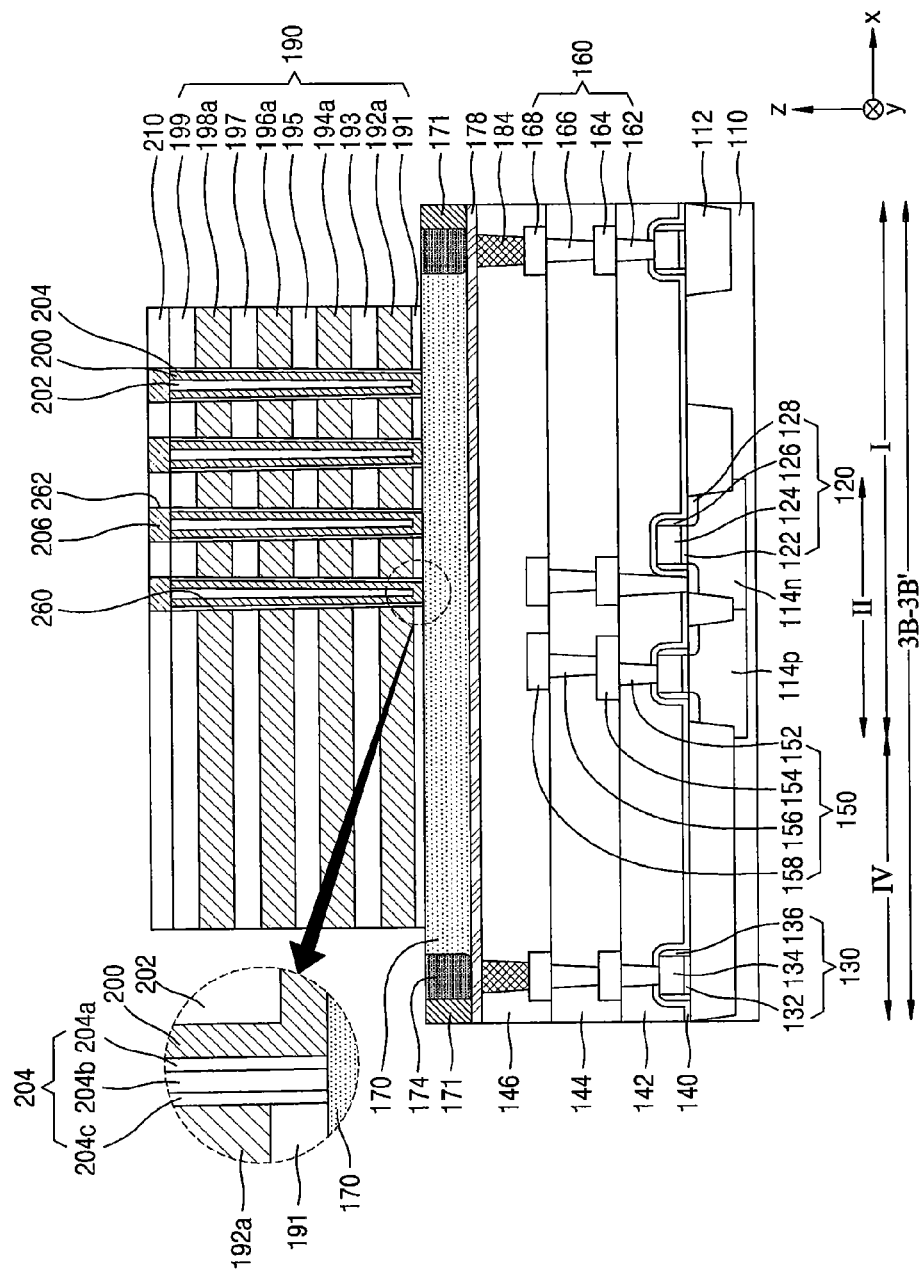

Referring to FIGS. 9 and 15B, the preliminary gate stack structure 190 is selectively etched to form a channel hole 260 penetrating through the preliminary gate stack structure 190 and extending in the third direction perpendicular to a main surface of the substrate 110 (730). When the channel hole 260 is formed, the arm layer 171 is provided according to some example embodiments so that a depth of the channel hole 260 may be uniformly and reliably formed. A plurality of channel holes 260 may be spaced apart from one another in the first direction and the second direction, and an upper surface of the semiconductor layer 170 may be exposed through a bottom portion of the channel hole 260.

A preliminary gate insulating layer is formed on side walls of the channel hole 260, on the upper surface of the semiconductor layer 170 that is exposed through the channel hole 260, and on the preliminary gate stack structure 190. After that, an anisotropic etching process is performed on the preliminary gate insulating layer to remove the portion of the preliminary gate insulating layer formed on the bottom portion of the channel hole 260 and the preliminary gate stack structure 190, so as to form the gate insulating layer 204 on the side walls of the channel hole 260 (740).

Accordingly, the upper surface of the semiconductor layer 170 may be exposed through the bottom portion of the channel hole 260 again. The gate insulating layer 204 may have a structure, in which the blocking insulating layer 204c, the charge storage layer 204b, and the tunnel insulating layer 204a are sequentially stacked on the side walls of the channel hole 260. Selectively, a barrier metal layer may be further formed on the side walls of the channel hole 260 before forming the blocking insulating layer 204c. The gate insulating layer 204 may be conformally formed on the side walls of the channel hole 260 to a predetermined thickness so that the channel hole 260 may not be completely embedded.

After that, a conductive layer and an insulating layer are sequentially formed on an inner wall of the channel hole 260 and the preliminary gate stack structure 190, and after that upper portions of the conductive layer and the insulating layer are planarized until an upper surface of the preliminary gate stack structure 190 is exposed so as to form the channel layer 200 and the embedded insulating layer 202 on the inner wall of the channel hole 260 (750). A bottom surface of the channel layer 200 contacts the upper surface of the semiconductor layer 170, which is exposed through the bottom portion of the channel hole 260 so that an outer surface of the channel layer 200 may contact the gate insulating layer 204.

The channel layer 200 may be formed by a CVD process, an LPCVD process, or an ALD process using polysilicon doped with impurities. However, the channel layer 200 may include polysilicon that is not doped with impurities. The embedded insulating layer 202 may be formed by a CVD process, an LPCVD process, or an ALD process using an insulating material such as silicon oxide, silicon nitride, or silicon oxynitride.

After that, the second etch-stop layer 210 covering the upper surfaces of the channel layer 200, the embedded insulating layer 202, and the gate insulating layer 204 may be formed on the preliminary gate stack structure 190. The second etch-stop layer 210 may include silicon nitride, silicon oxide, or silicon oxyntirde.

A drain hole 262 exposing the upper surfaces of the channel layer 200 and the embedded insulating layer 202 is formed on the second etch-stop layer 210, and a conductive layer filling the drain hole 262 is formed. Then, an upper portion of the conductive layer is planarized to form the drain region 206 (760). An upper surface of the drain region 206 may be formed at the same layer level as that of the upper surface of the second etch-stop layer 210.

Referring to FIGS. 10A, 10B, 15A, and 15C, the upper wiring structure and the peripheral wiring structure that are respectively connected to the memory cell and the peripheral circuit are formed (800). Processes of manufacturing the upper wiring structure and the peripheral wiring structure will be described below.

The second etch-stop layer 210 and the preliminary gate stack structure 190 are selectively etched to form an opening 264 and a preliminary vertical contact hole 266 in the second etch-stop layer 210 and the preliminary gate stack structure 190 (810 and 820).

In some example embodiments, an anisotropic etching process may be performed to obtain the opening 264 and the preliminary vertical contact hole 266. When the opening 264 and preliminary vertical contact hole 266 are formed, the arm layer 171 is provided according to some example embodiments so that the opening 264 and the preliminary contact hole 266 may be formed uniformly and reliably.

The opening 264 may expose an upper surface of the common source region 172, and the preliminary vertical contact hole 266 may expose the upper surface of the semiconductor layer 170. The preliminary vertical contact hole 266 may be spaced apart a predetermined distance from the channel layer 200 in the first direction.

Figure 10A:
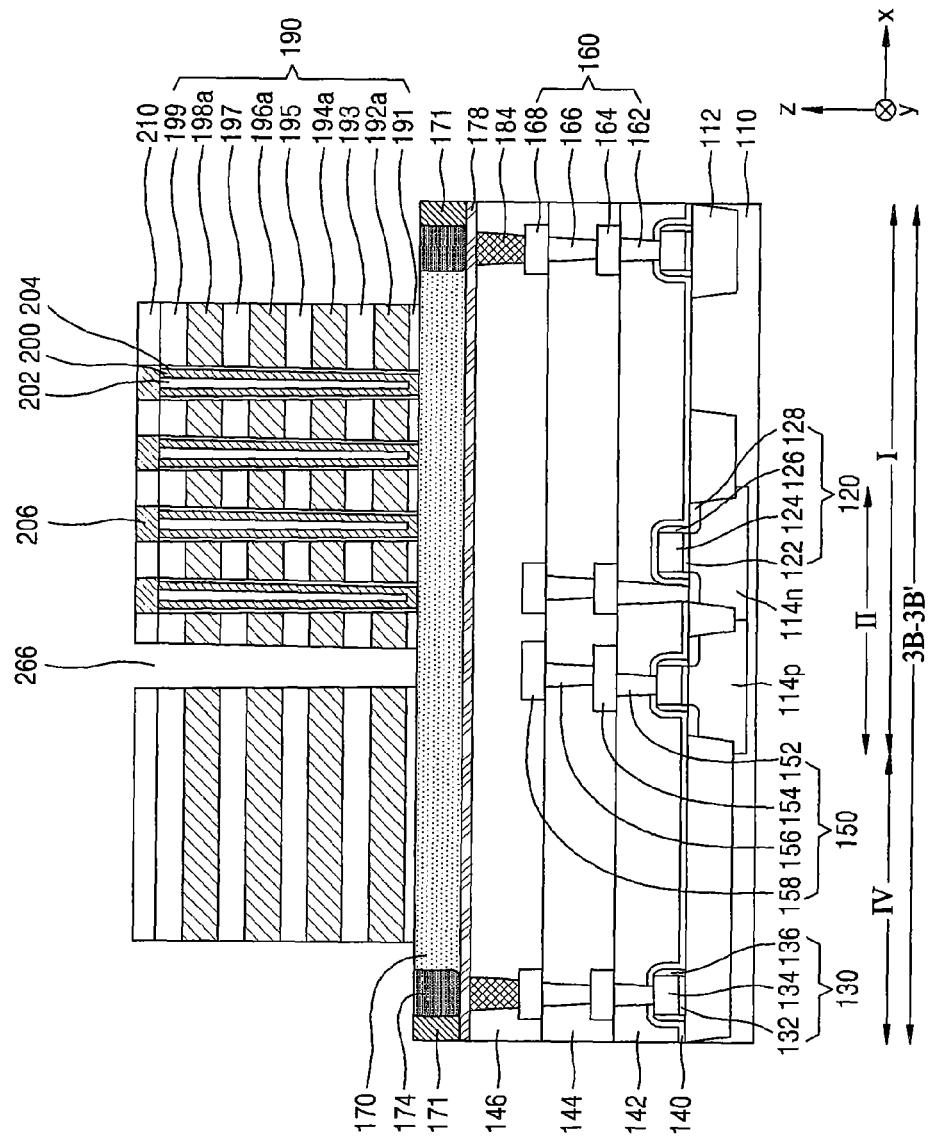
Figure 10B:
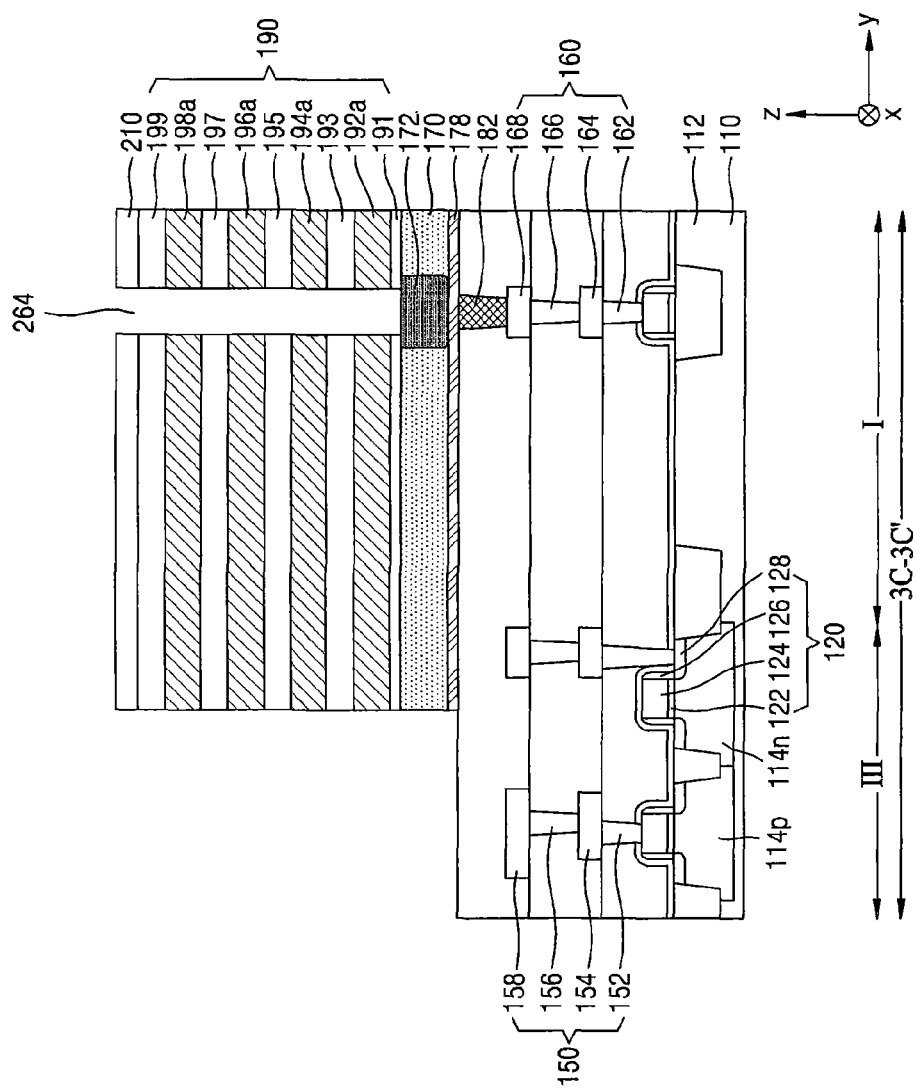
Figure 11:
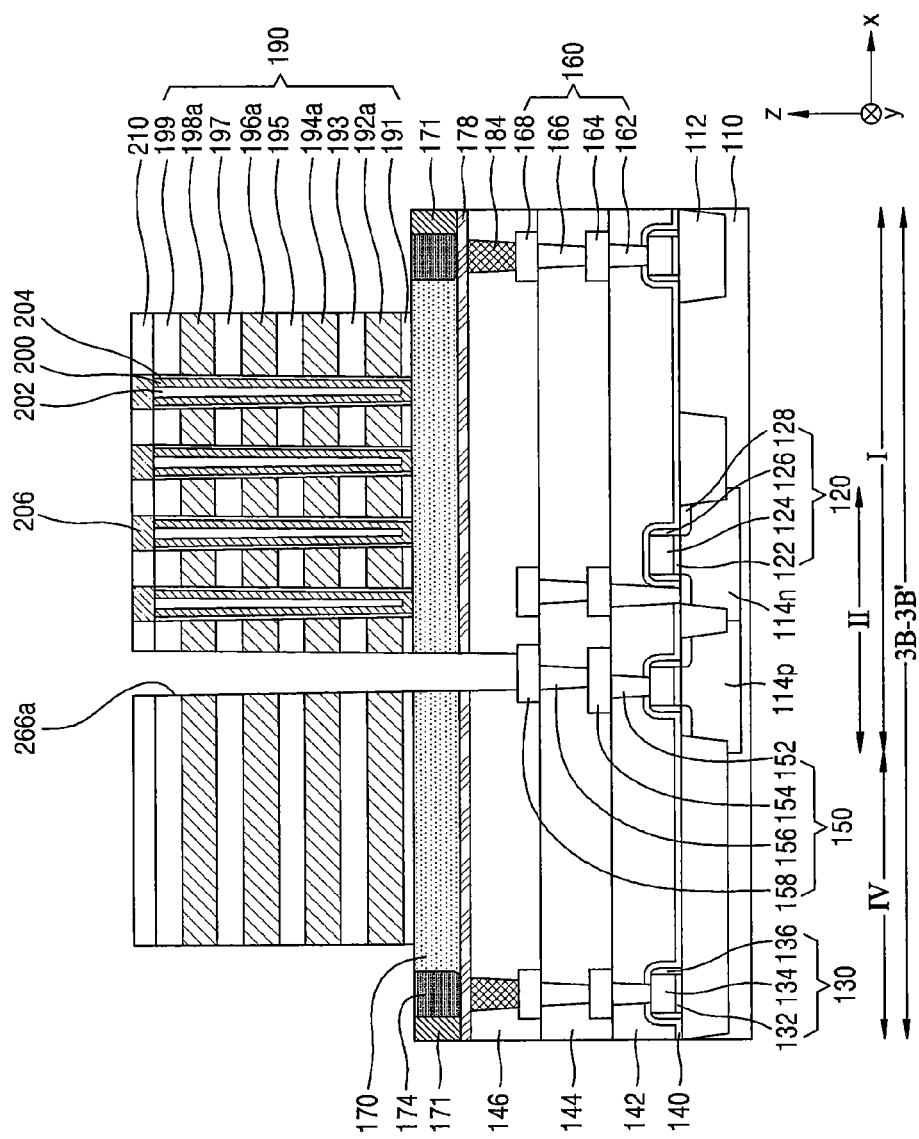

Referring to FIGS. 11, and 15C, a portion of the semiconductor layer 170, a portion of the barrier metal layer 178, and a portion of the third interlayer insulating layer 146, which are exposed through the bottom portion of the preliminary vertical contact hole 266 (see FIG. 10A), may be sequentially removed so as to form a vertical contact hole 266a that is obtained by expanding the preliminary vertical contact hole 266 downward (820). An upper surface of the second lower wiring layer 158 may be exposed through a bottom portion of the vertical contact hole 266a.

In some example embodiments, an anisotropic etching process may be used in the process of forming the vertical contact hole 266a. In some example embodiments, the preliminary vertical contact hole 266 and the vertical contact hole 266a are described as being etched through two stages, but may be etched at once. In particular, according to some embodiments, even when an aspect ratio between the preliminary vertical contact hole 266 and the vertical contact hole 266a is large, the preliminary vertical contact hole 266 and the vertical contact hole 266a may be formed at once (i.e., simultaneously/in one step).

In addition, unlike the example shown in FIGS. 10A to 11, the vertical contact hole 266a may be formed after forming the opening 264. In this case, after forming the opening 264, the second etch-stop layer 210, the preliminary gate stack structure 190, the semiconductor layer 170, the barrier metal layer 178, and the third interlayer insulating layer 146 are sequentially etched to form the vertical contact hole 266a.

Figure 12A:
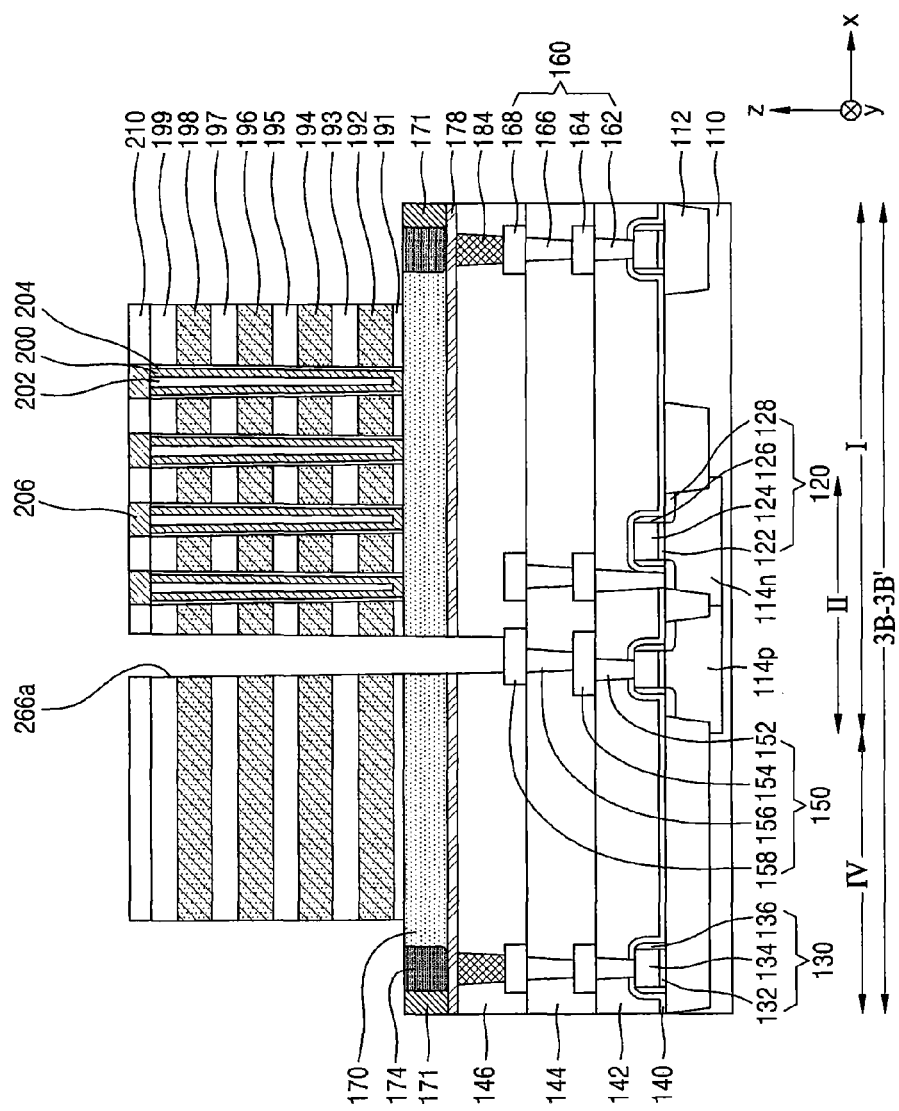
Figure 12B:
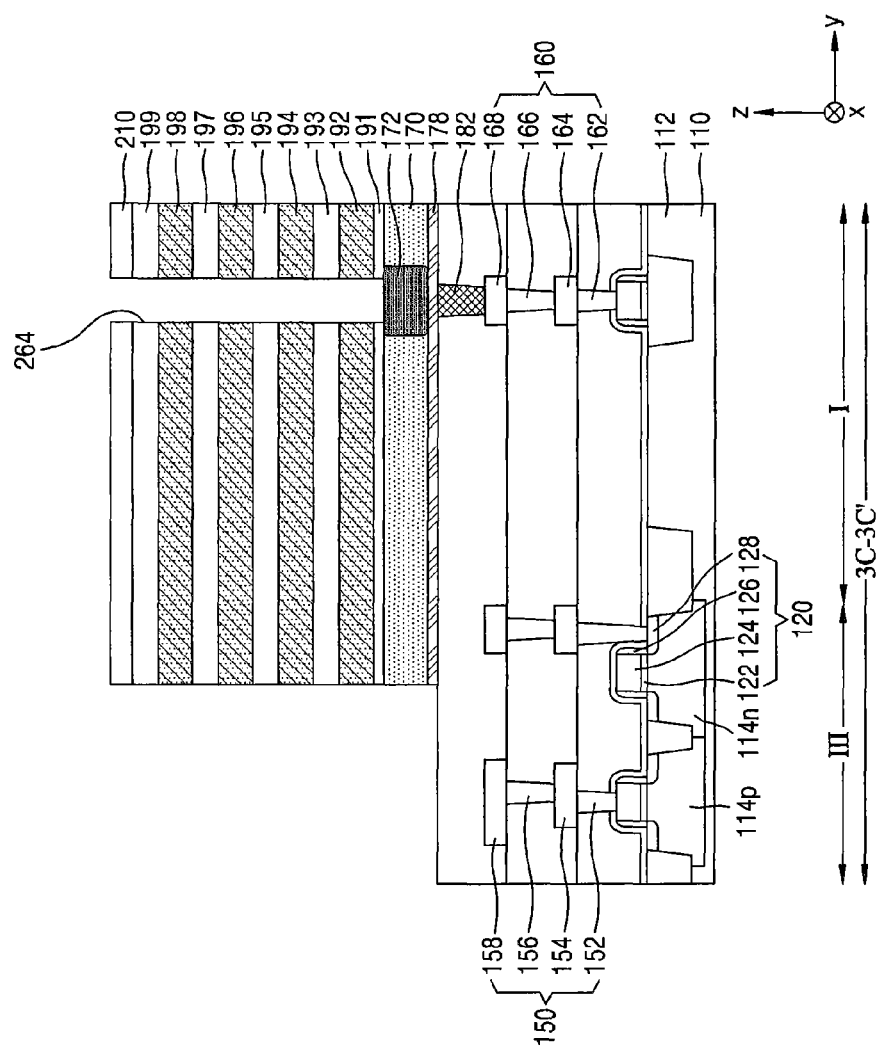

Referring to FIGS. 12A, 12B, and 15C, a silicidation process is performed on the preliminary gate stack structure 190 to convert the first to fourth preliminary gate conductive layers 192a, 194a, 196a, and 198a respectively into the ground selection line 192, the first word line 194, the second word line 196, and the string selection line 198 (830). Here, the ground selection line 192, the first word line 194, the second word line 196, and the string selection line 198 may include a metal silicide material such as tungsten silicide, tantalum silicide, cobalt silicide, or nickel silicide.

Otherwise, the first to fourth preliminary gate conductive layers 192a, 194a, 196a, and 198a exposed through the opening 264 are selectively removed, and a conductive material may be embedded in spaces between the insulating layers 191, 193, 195, 197, and 199 to form the ground selection line 192, the word lines 194 and 196, and the string selection line 198.

Here, the ground selection line 192, the word lines 194 and 196, and the string selection line 198 may include a metal material such as tungsten, tantalum, cobalt, or nickel. Selectively, before embedding the conductive material, a barrier metal layer may be further formed on the gate insulating layer 204 exposed in spaces between the insulating layers 191, 193, 195, 197, and 199.

Figure 13A:
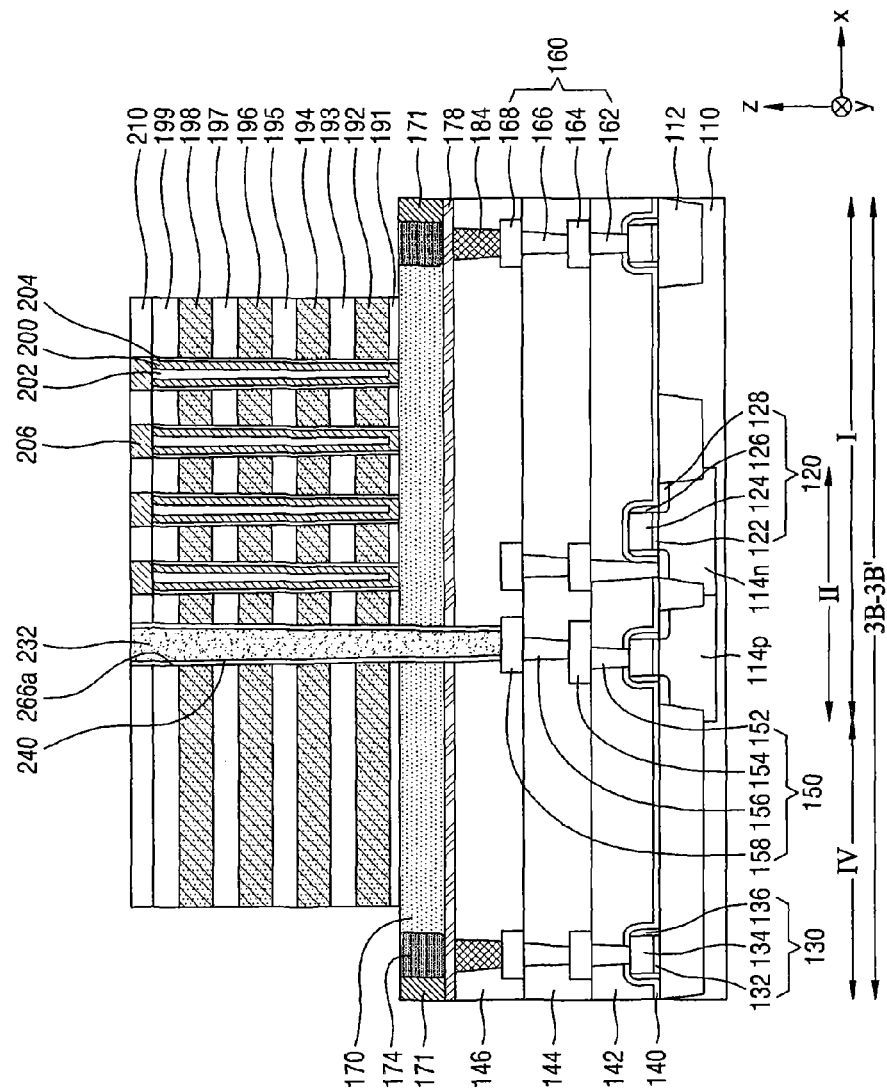
Figure 13B:
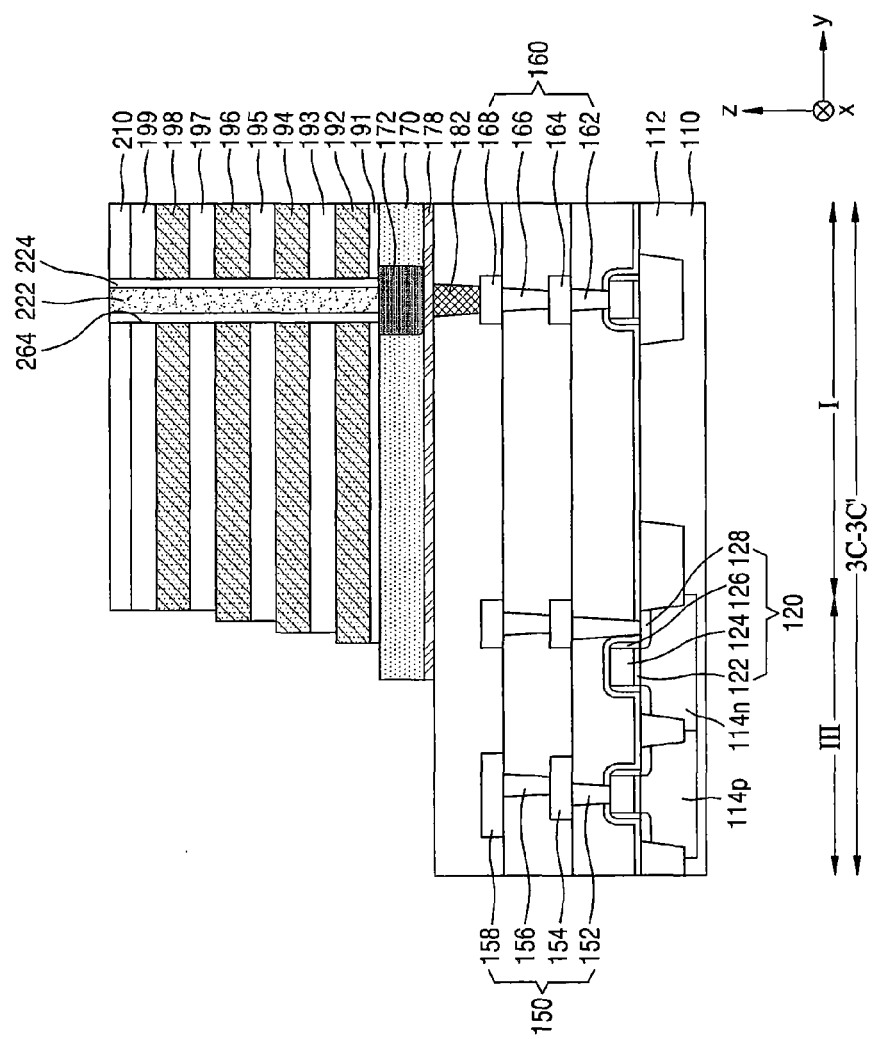
Figure 14:
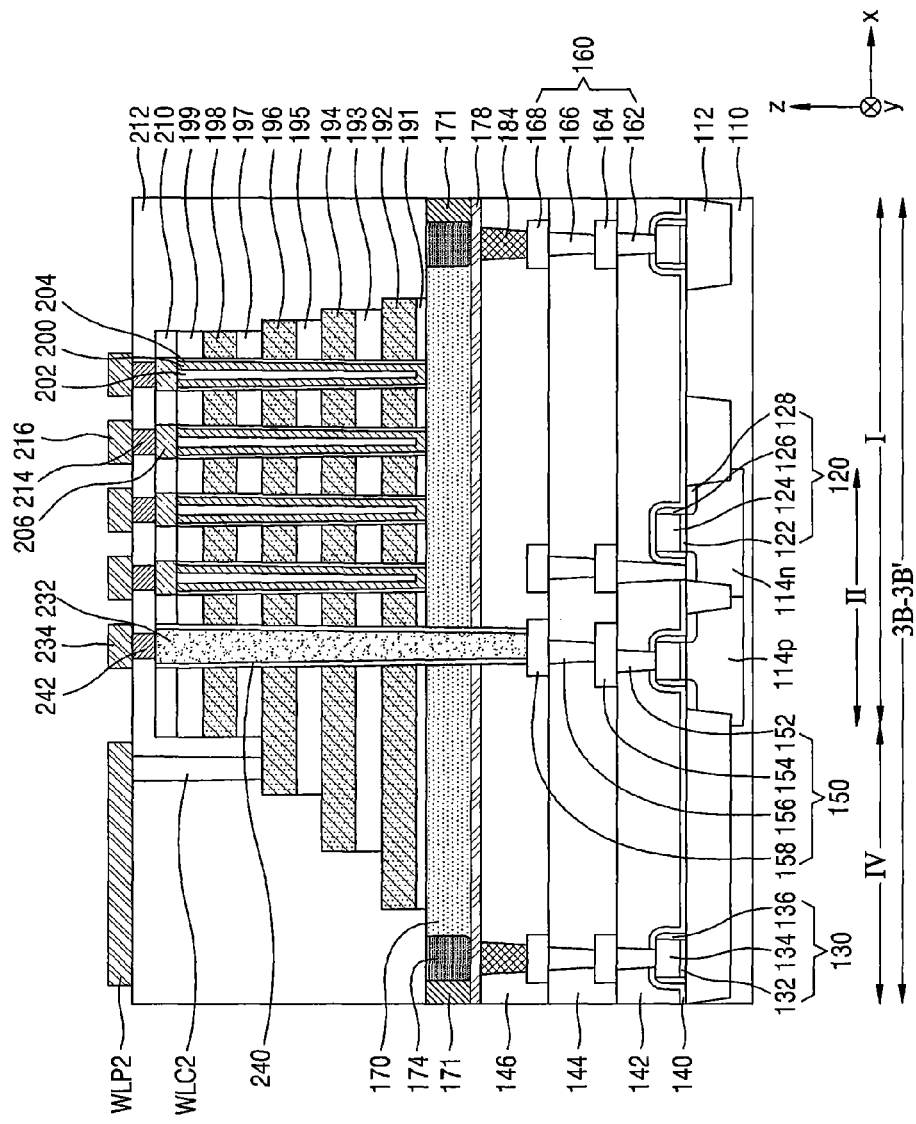

Referring to FIGS. 13A, 13B, and 15C, an insulating layer is formed on the inner wall of the opening 264 and the vertical contact hole 266a, and on the second etch-stop layer 210, and then, the insulating layer is anisotropically etched to form a common source line spacer 224 and a vertical contact spacer 240 respectively on opposite side walls of the opening 264 and the side wall of the vertical contact hole 266a. The common source line spacer 224 and the vertical contact spacer 240 may include an insulating material such as silicon oxide, silicon nitride, or silicon oxynitride.

After that, a conductive layer for embedding the opening 264 and the vertical contact hole 266a is formed, and an upper portion of the conductive layer is planarized until an upper surface of the second etch-stop layer 210 is exposed so as to form the common source line 222 and the vertical contact 232 respectively on the inner walls of the opening 264 and the vertical contact hole 266a (840 and 850).

Referring to FIGS. 3B, 3C, 14 and 15C, a plurality of patterning processes using a mask are performed to pattern the ground selection line 192, the word lines 194 and 196, and the string selection line 198. Here, side surfaces of the fifth insulating layer 199 and the fourth insulating layer 197 may be patterned to be aligned with a side surface of the string selection line 198, and side surfaces of the third insulating layer 195 and the second insulating layer 193 may be patterned to be aligned with side surfaces of the second word line 196 and the first word line 194, respectively. In addition, a side surface of the first insulating layer 191 may be patterned to be aligned with the ground selection line 192.

After that, the fourth interlayer insulating layer 212 that covers the side surfaces of the second etch-stop layer 210, and the patterned ground selection line 192, the word lines 194 and 196, and the string selection line 198 may be formed.

A dummy bit line contact hole and a bit line contact hole for exposing upper surfaces of the vertical contact 232 and the drain region 206 are formed in the fourth interlayer insulating layer 212, and a conductive material is embedded in the dummy bit line contact hole and the bit line contact hole. Then, an upper portion of the conductive material is planarized until an upper surface of the fourth interlayer insulating layer 212 to form the dummy bit line contact 242 and the bit line contact 214.

A string selection line contact hole exposing the string selection line 198, word line contact holes exposing the word lines 194 and 196, and a ground selection line contact hole exposing the ground selection line 192 may be formed on the planarized fourth interlayer insulating layer 212 in the pad region IV.

In addition, a peripheral circuit contact hole exposing the second lower wiring layer 158 in the second peripheral circuit region III may be formed. A conductive material is embedded in the string selection line contact hole, the word line contact holes, the ground selection line contact hole, and the peripheral circuit contact hole, and then, an upper portion of the conductive material is planarized until the upper surface of the fourth interlayer insulating layer 212 is exposed so as to form the string selection line contact SSLC, the word line contacts WLC1 and WLC2, the ground selection line contact GSLC, and the peripheral circuit contact 243.

A conductive layer is formed on the fourth interlayer insulating layer 212, and then, is patterned to form the bit line 216, the dummy bit line 234, the string selection line pad SLP, the word line pads WLP1 and WLP2, the ground selection line pad GSLP, and the peripheral circuit line 244 that are respectively connected to the bit line contact 214, the dummy bit line contact 242, the string selection line contact SSLC, the word line contacts WLC1 and WLC2, the ground selection line contact GSLC, and the peripheral circuit contact 243 (860 and 870).

Referring again to FIGS. 3B and 3C, the fifth interlayer insulating layer 218 covering the bit line 216, the dummy bit line 234, the string selection line pad SLP, the word line pads WLP1 and WLP2, the ground selection line pad GSLP, and the peripheral circuit line 244 may be formed on the fourth interlayer insulating layer 212.

A third wire contact hole exposing an upper surface of the dummy bit line 234 is formed in the fifth interlayer insulating layer 218, and after that, a conductive material is embedded in the third wire contact hole to form the third wire contact 238. The upper wiring layer 236 that is electrically connected to the third wire contact 238 may be formed on the fifth interlayer insulating layer 218. Moreover, in some embodiments, an upper wiring structure (or upper wiring layer) that is electrically connected to the bit line 216, the ground selection line and word lines, and the string selection line may be formed (870).

Through the above manufacturing processes, the peripheral circuit wiring structure 230 including the vertical contact 232, the dummy bit line 234, the upper wiring layer 236, the third wire contact 238, and the dummy bit line contact 242 may be formed (880). The upper wiring layer 236 may include, for example, metal such as aluminium, copper, or nickel. Through the above described processes, the semiconductor chip 1000 may be manufactured.

Figure 16A:
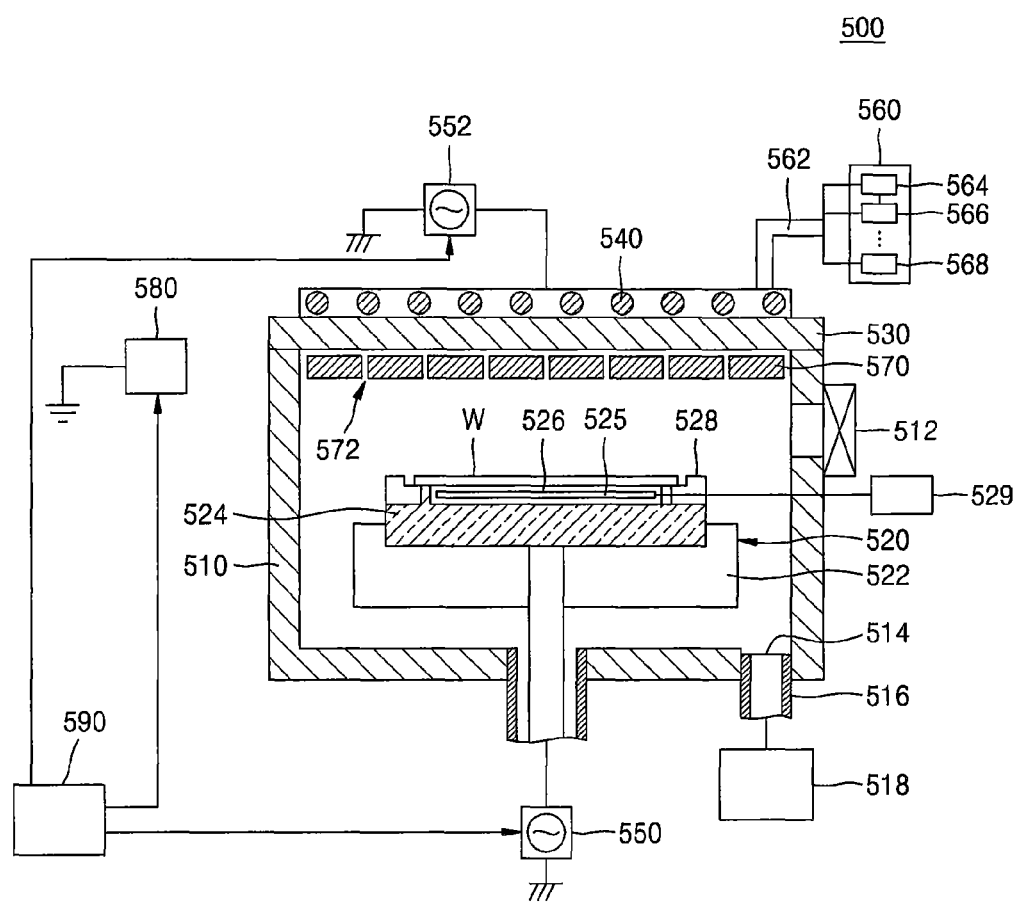
FIG. 16A is a schematic diagram of an etching apparatus used in methods of manufacturing a semiconductor chip according to some embodiments.
Figure 16B:
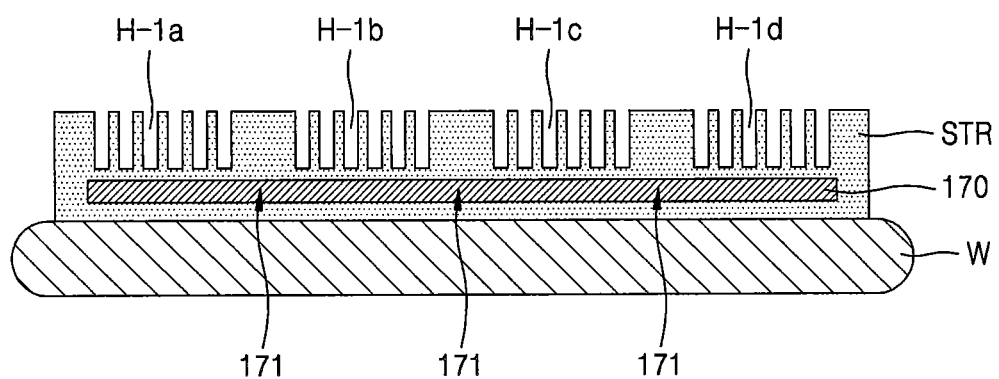
FIG. 16B is a diagram illustrating an etching process of a hole portion including a channel hole, an opening, and a vertical contact hole of a semiconductor chip by using the etching apparatus of FIG. 16A.
Figure 16C:
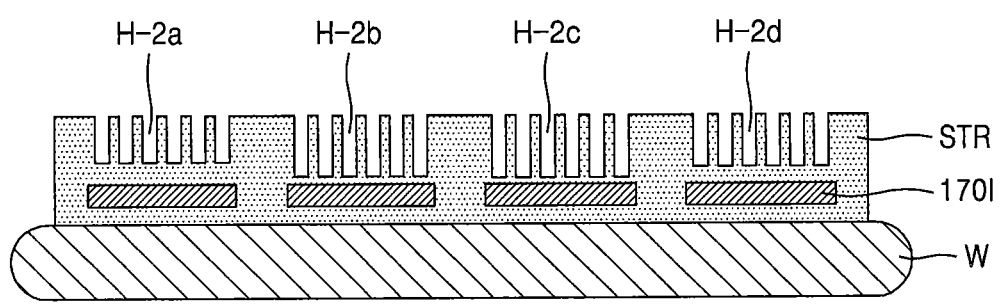
FIG. 16C is a cross-sectional view of an etching process of a hole portion according to a comparative example.

FIG. 16A is a schematic diagram of an etching device 500 used in methods of manufacturing a semiconductor chip according to some example embodiments, and FIG. 16B is a diagram illustrating a process of etching a hole portion including a channel hole, an opening, and a vertical contact hole of the semiconductor chip by using the etching device 500 of FIG. 16A, and FIG. 16C is a cross-sectional view of processes of etching a hole portion according to a comparative example.

Referring to FIG. 16A, the etching device 500 used in methods of manufacturing a semiconductor chip according to some example embodiments may be a dry etching device. The etching device 500 may be a plasma etching device using plasma. The etching device 500 may be an inductively coupled plasma (ICP) etching device. The ICP etching device 500 may perform an etching process by generating plasma from an etching gas sprayed from a gas nozzle by an electromagnetic field induced by a coil type antenna. A radio frequency (RF) power applied to the coil type antenna may be transferred to the etching gas via a dielectric plate.

In some embodiments, the ICP etching device is provided as an example of the etching device 500, but a capacitively coupled plasma (CCP) etching device may also be used. The CCP etching device applies RF power to opposite chucks so as to generate an RF electric field between the opposite chucks, and then, performs the etching process by generating plasma from the etching gas sprayed from a dielectric window by the RF electric field.

The etching device 500 may include an etching chamber 510, a substrate stage 520 including a lower electrode 524, an upper electrode 540, a conductive shield member 570, and a shield electric power supply 580. The etching chamber 510 may provide a sealed space for performing a plasma treatment on a substrate W, that is, a wafer. The substrate W may be a semiconductor substrate, e.g., a silicon substrate.

In the etching chamber 510, the substrate stage 520 for supporting the substrate W may be disposed. For example, the substrate stage 520 may include the lower electrode 524 of a disc shape as a susceptor for supporting the substrate W. The lower electrode 524 may be supported by a support member 522 to be movable up and down.

An exhaust hole 514 is provided at a lower portion of the etching chamber 510, and the exhaust hole 514 may be connected to an exhaust portion 518 via an exhaust pipe 516. The exhaust portion 518 includes a vacuum pump such as a turbo molecular pump so as to adjust a processing space in the etching chamber 510 to a desired degree of vacuum. That is, the exhaust portion 518 may adjust a pressure in the etching chamber 510. A gate 512 through which the substrate W may enter and exit the etching chamber 510 may be formed in a side wall of the etching chamber 510.

An electrostatic chuck 526 for sucking the substrate W may be provided on an upper surface of the lower electrode 524. The electrostatic chuck 526 may include a conductive substance of a sheet type or a net type in a dielectric layer. The conductive substance may suck the substrate W and maintain the sucked state of the substrate W by using a direct current (DC) voltage supplied from a DC power source. A heater 525 for heating the substrate W may be provided in the electrostatic chuck 526. The heater 525 may be connected to a heater adjuster 529. The heater adjuster 529 adjusts the heater 525 to adjust a temperature of the substrate W on the electrostatic chuck 526.

The substrate W may be mounted on the upper surface of the lower electrode 524, and a focus ring 528 may be provided on a boundary of the substrate W. The lower electrode 524 may have a diameter that is greater than that of the substrate W. The lower electrode 524 may include a circulation channel therein for cooling down the temperature. For accurately adjusting the temperature of the substrate W, a cooling gas such as He gas may be supplied between the electrostatic chuck 526 and the substrate W.

A window 530 may be formed in an upper portion of the etching chamber 510. The window 530 may occupy entirely the upper portion or a part of the upper portion of the etching chamber 510. For example, the window 530 may include an insulating material such as alumina (Al$_2$O$_3$). The etching device 500 may further include a gas supply portion 560. A processing gas may be supplied from the gas supply portion 560 into the etching chamber 510 via a gas supplying tube 562.

The gas supply portion 560 may include a main etching gas supply 564 for supplying a main etching gas that is used to etch a layer to be etched on the substrate W, an auxiliary etching gas supply 566 for supplying an auxiliary etching gas that is used to etch the layer to be etched on the substrate W, and an inert gas supply 568 for adjusting concentrations of the main etching gas and the auxiliary etching gas. The gas supplying portion 560 may adjust the concentration of the main etching gas and the auxiliary etching gas with respect to the inert gas.

The upper electrode 540 may be disposed outside the etching chamber 510 to face the lower electrode 524 as the window 530 is interposed between the upper electrode 540 and the lower electrode 524. The upper electrode 540 may include an RF antenna. The RF antenna may be an ICP antenna. The etching device 500 may further include a first RF power supply unit 550 for applying a first RF signal to the lower electrode 514, and a second RF power supply unit 552 for applying a second RF signal to the upper electrode 540.

The first RF power supply unit 550 may include a first RF power source and a first matcher. The second RF power supply unit 552 may include a second RF power source and a second matcher. The etching device 500 may include a controller 590 for controlling the first and second RF power supply units 550 and 552. The controller 590 may include a microcomputer and various interfaces, and may control operations of the etching device according to information about programs and recipes stored in an external memory and an internal memory.

The first RF power supply unit 550 may apply a first RF signal to the lower electrode 524. The second RF power supply unit 552 may apply a second RF signal to the upper electrode 540. The first and second RF signals may be RF power having predetermined frequency (e.g., 13.56 MHz).

The conductive shield member 570 may be provided in the etching chamber 510 so as to cover the window 530. The conductive shield member 570 may have a shape corresponding to that of the window 530. For example, if the window 530 has a disc shape, the conductive shield member 570 may also have a disc shape.

The shield power supply 580 may apply a shield signal to the conductive shield member 570. The shield signal may be an alternating current (AC) power or a DC power. When the AC power or the DC power is applied to the conductive shield member 570, an electric field may be generated in the conductive shield member 570. The conductive shield member 570 may include a plurality of slits 572 for passing the magnetic field generated by the upper electrode 540. The conductive shield member 570 may include metal such as aluminium.

When the semiconductor chip as above is manufactured, the hole portions such as the channel hole, the opening, and the vertical contact hole may be formed by using the etching device 500. As shown in FIG. 16B, when the semiconductor chip is manufactured according to some example embodiments, the semiconductor layer 170 and the arm layer 171 are formed on the substrate W (that is, wafer). The semiconductor layer 170 and the arm layer 171 may be electrically connected to each other. Accordingly, when a layer to be etched STR is etched by using the etching device 500, voltages (or plasma power) applied to the hole portions H-1a, H-1b, H-1c, and H-1d are constant, and accordingly, the hole portions H-1a, H-1b, H-1c, and H-1d may have constant depths.

On the other hand, according to the comparative example of FIG. 16C, semiconductor layers 170I separate from one another are formed on the substrate W (that is, wafer) when the semiconductor chip is manufactured. Accordingly, when a layer to be etched STR is etched by using the etching device 500, voltages applied to hole portions H-2a, H-2b, H-2c, and H-2d are not constant, and thus, the hole portions H-2a, H-2b, H-2c, and H-2d may have different depths from each other. Moreover, if aspect ratios of the hole portions H-2a, H-2b, H-2c, and H-2d are large and the hole portions H-2a, H-2b, H-2c, and H-2d are over etched, variation between the depths of the hole portions H-2a, H-2b, H-2c, and H-2d may increase.

Figure 17A:
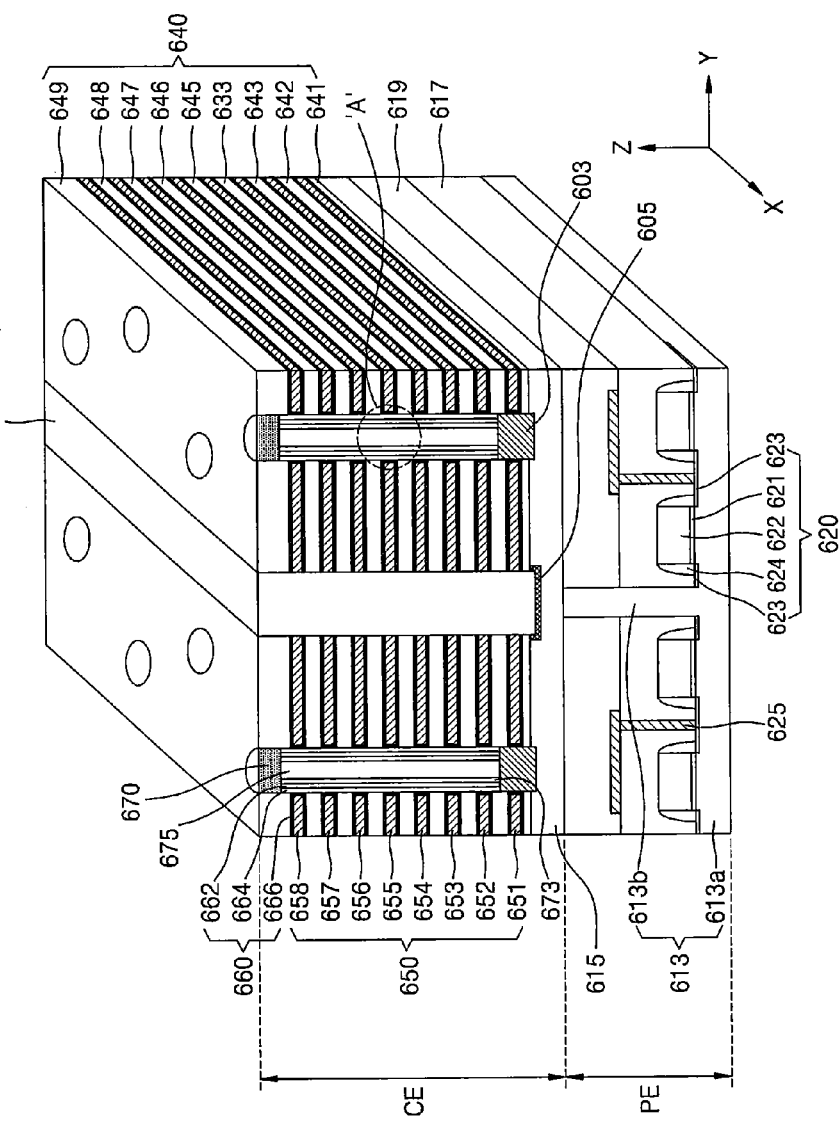
FIG. 17A is a perspective view of a semiconductor chip according to some embodiments.
Figure 17B:
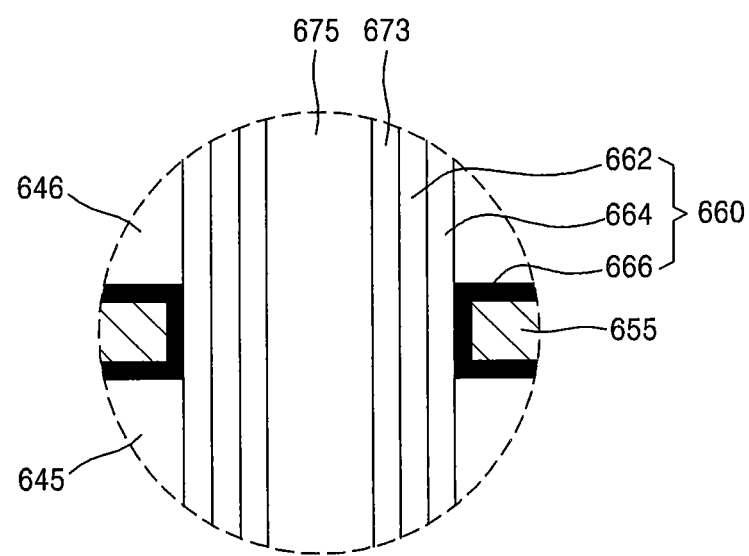
FIG. 17B is an enlarged view of a part of FIG. 17A.
Figure 17C:
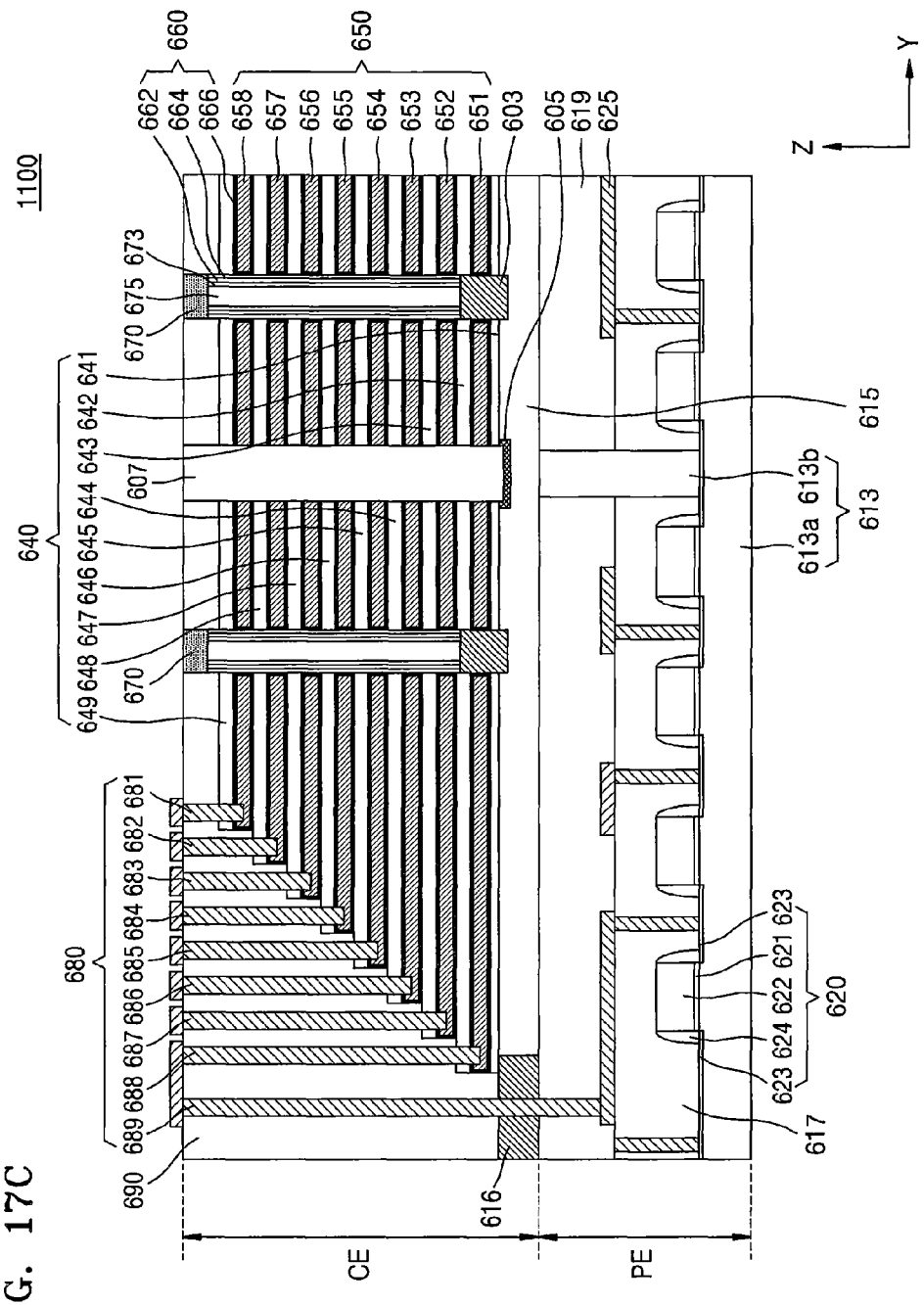
FIGS. 17C and 17D are cross-sectional views of main elements in a semiconductor chip according to some embodiments.
Figure 17D:
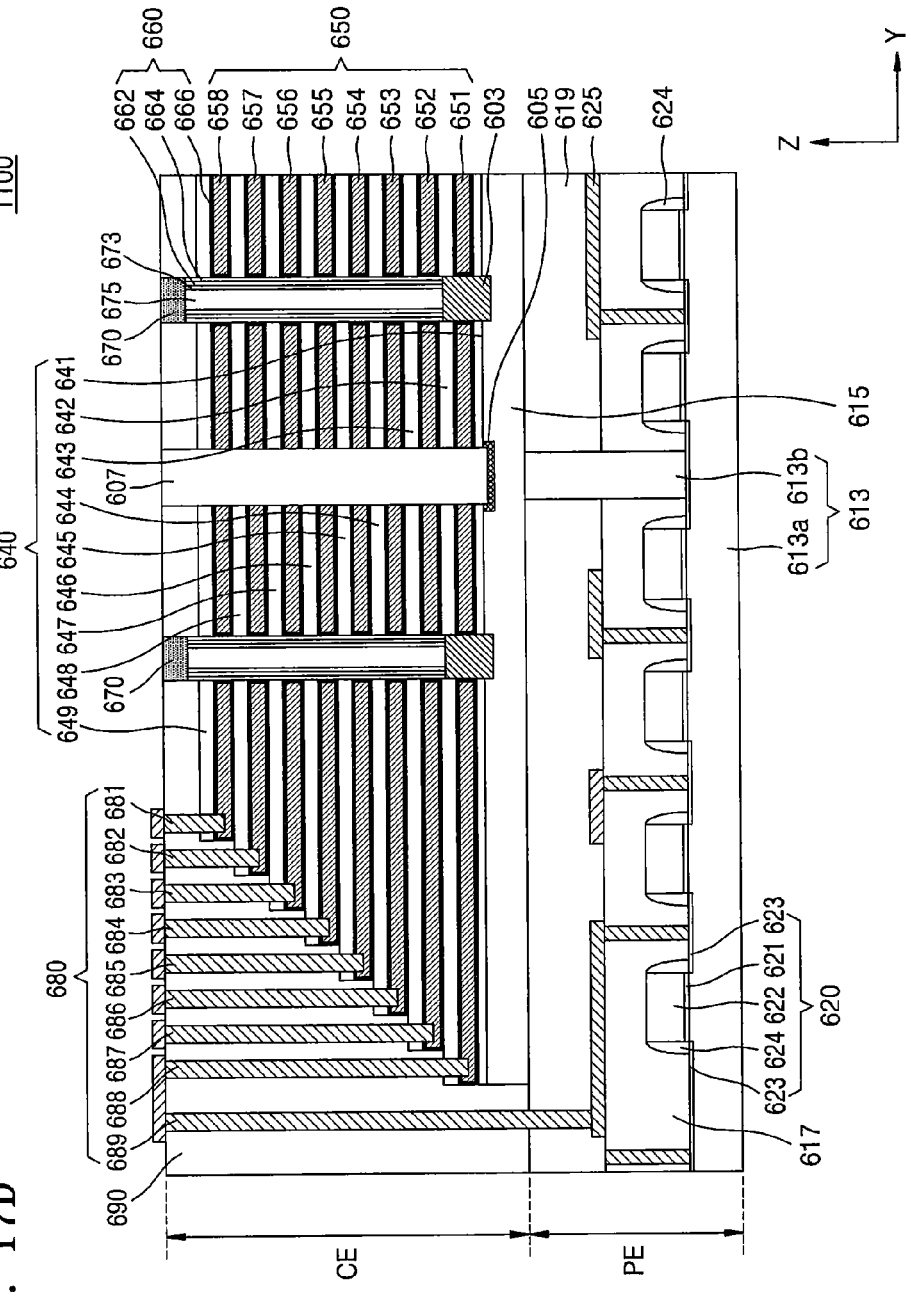

FIG. 17A is a perspective view showing main elements of a semiconductor chip 1100 according to some example embodiments, FIG. 17B is a partially enlarged view of a portion A of the semiconductor chip of FIG. 17A, and FIGS. 17C and 17D are cross-sectional views showing main elements of the semiconductor chip 1100 according to some example embodiments.

In detail, the semiconductor chip 1100 may be a peripheral circuit wiring structure, in which a part 689 of a wiring structure 680 is electrically connected to a peripheral circuit in a pad region that is located at a side of a cell region, as shown in FIG. 17C. The semiconductor chip 1100 may correspond to the semiconductor chip 12 shown in FIGS. 1A-2C.

The semiconductor chip 1100 includes a substrate 613 having a first region 613a and a second region 613b. A peripheral circuit gate structure 620 and first and second interlayer insulating layers 617 and 619 may be formed on the first region 613a of the substrate 613.

The peripheral circuit gate structure 620 may include a peripheral circuit gate insulating layer 621, a peripheral circuit gate electrode layer 622, a peripheral circuit spacer 624, and source and drain regions 623. The peripheral circuit gate structure 620 forms a peripheral circuit device. A semiconductor layer 615 may be formed on the first and second interlayer insulating layers 617 and 619 and the second region 613b.

The semiconductor layer 615 may correspond to the reference numeral 14 shown in FIGS. 1A to 1D and FIGS. 2A to 2C. As shown in FIG. 17C, an arm layer 616 that is electrically connected to the semiconductor layer 615 may be formed at a side of the semiconductor layer 615. The arm layer 616 may correspond to the reference numeral 18 shown in FIGS. 1A to 1D and FIGS. 2A to 2C.

The semiconductor chip 1100 may include a channel layer 673 disposed in a direction perpendicular to an upper surface of the semiconductor layer 615, and a plurality of insulating layers 640 and a plurality of gate electrode layers 650 that are stacked along an external wall of the channel layer 673. The semiconductor chip 1100 may include a gate insulating layer 660 disposed between the plurality of gate electrode layers 650 and the channel layer 673, and an embedded insulating layer 675 may be disposed in the channel layer 673.

The substrate 613 may have an upper surface extending in an x-axis direction and a y-axis direction. The substrate 613 may include a semiconductor material, e.g., a group-IV semiconductor, a group III-V compound semiconductor, or a group II-VI oxide semiconductor. For example, when the substrate 613 includes a group-IV semiconductor, the substrate 613 may be a silicon substrate. In addition, the substrate 613 may be provided as a bulk wafer or an epitaxial layer.

The peripheral circuit gate structure 620 may configure/provide a peripheral circuit region on the upper surface of the first region 613a of the substrate 613. That is, the peripheral circuit region PE of the semiconductor chip 1100 may be disposed under a cell region CE. The substrate 613 is disposed under the semiconductor layer 615, and the second region 613b of the substrate 613 may contact the semiconductor layer 615.

A wiring layer 625 that is electrically connected to the peripheral circuit gate structure 620 may be formed on the first region 613a of the substrate 613. The peripheral circuit gate structure 620 may include a horizontal type transistor. The first region 613a of the substrate 613 extends in a direction perpendicular to the upper surface of the first region 613a to contact the lower surface of the second region 613b. A part on the surface of the substrate 613 is removed by the etching process to form the first region 613a and the second region 613b.

After forming the peripheral circuit gate structure 620 on the first region 613a, the first and second interlayer insulating layers 617 and 619 and the wiring layer 625 may be formed on the peripheral circuit gate structure. The first and second interlayer insulating layers 617 and 619 may be formed as high density plasma (HDP) oxide layers for effectively filling the space between the peripheral circuit gate structures 620. In some example embodiments, the semiconductor layer 615 may be obtained by forming amorphous silicon on the second interlayer insulating layer 619 so as to contact the second region 613b and by single crystallizing the amorphous silicon layer from the second region 613b.

The channel layers 673 may be disposed on the upper surface of the semiconductor layer 615 so as to extend in a direction (z-axis direction) perpendicular to the upper surface of the semiconductor layer 615. Each of the channel layers 673 may be formed as an annular type surrounding the embedded insulating layer 675 disposed therein, but may be formed as a pillar shape such as a cylinder or an angular pillar without the embedded insulating layer 675, according to some example embodiments. The channel layers 673 may be spaced apart from one another in the x-axis direction and the y-axis direction. The channel layers 673 may be variously arranged according to some example embodiments, for example, may be arranged in zig-zags in at least one direction. Two adjacent channel layers 673 as a separation insulating layer 607 is disposed therebetween may be symmetric with each other as shown in the drawings, but are not limited thereto.

The channel layer 673 directly contacts the semiconductor layer 615 by a lower surface thereof, so as to be electrically connected to the semiconductor layer 615. The channel layer 673 may include a semiconductor material such as polysilicon or single crystalline silicon, and the semiconductor material may not be doped with impurities, or may include p-type or n-type impurities. A plurality of gate electrode layers 650 (including 651 to 658) may be spaced apart from one another from the semiconductor layer 615 in the z-axis direction along a side surface of the channel layer 673.

Figure 18:
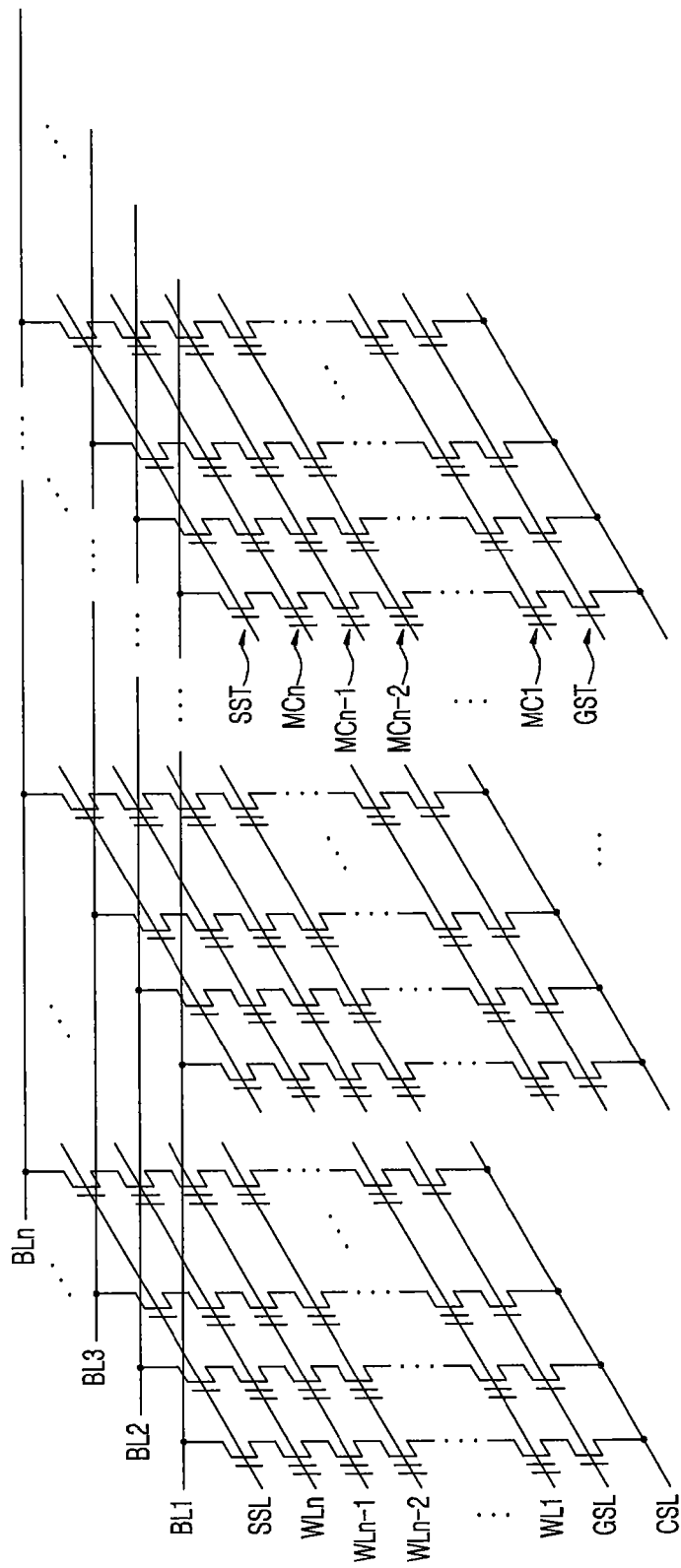
FIG. 18 is an equivalent circuit diagram of a memory cell array of a semiconductor chip according to some embodiments.

Referring to FIG. 18, each of the plurality of gate electrode layers 650 may configure gates of the ground selection transistor GST, the plurality of memory cells MC1 to MCn, and the string selection transistor SST. The gate electrode layers 650 may extend configuring/providing the word lines WL1 to WLn, and may be commonly connected to adjacent memory cell strings of a predetermined unit arranged in the x-axis direction and the y-axis direction.

In some example embodiments, six gate electrode layers 652 to 657 are arranged in each of the memory cells MC1 to MCn, but one or more example embodiments are not limited thereto, that is, the number of gate electrode layers forming the memory cells MC1 to MCn may be determined according to a capacity of the semiconductor chip 1100. For example, the number of the gate electrode layers forming the memory cells MC1 to MCn may be 2n (n is a natural number). The gate electrode layer 651 of the ground selection transistor GST may form the ground selection line GSL. The gate electrode layer 658 of the string selection transistor SST may form the string selection line SSL. In particular, the gate electrode layer 658 of the string selection transistor SST may be formed to be branched between two adjacent memory cell strings to form different string selection lines SSL from each other. According to some example embodiments, the string selection transistor SST may include two or more gate electrode layers 658 and the ground selection transistor GST may also include two or more gate electrode layers 651. In addition, the gate electrode layers 651 and 658 may have different structures from those of the gate electrode layers 652 to 657 of the memory cells MC1 to MCn.

The plurality of gate electrode layers 650 may include polysilicon or metal silicide material. The metal silicide material may be a silicide material of a metal material selected from, for example, Co, Ni, Hf, Pt, W, and Ti. In some example embodiments, the plurality of gate electrode layers 650 may include a metal material, e.g., tungsten (W).

A plurality of insulating layers 640 (including 641 to 649) may be arranged between the plurality of gate electrode layers 650. The plurality of insulating layers 640 may be spaced apart from one another in the z-axis direction and extend in the y-axis direction, like the plurality of gate electrode layers 650. The plurality of insulating layers 640 may include an insulating material such as silicon oxide or silicon nitride.

The gate insulating layer 660 may be disposed between the plurality of gate electrode layers 650 and the channel layer 673. The gate insulating layer 660 may include a tunnel insulating layer 662, a charge storage layer 664, and a blocking insulating layer 666 that are sequentially stacked from the channel layer 673. The tunnel insulating layer 662 may tunnel charges to the charge storage layer 664 in an F—N way. The tunnel insulating layer 662 may include, for example, silicon oxide, hafnium oxide, zirconium oxide, or tantalum oxide.

The charge storage layer 664 may be a charge trap layer or a floating gate conductive layer. For example, the charge storage layer 664 may include a dielectric material, quantum dots, or nanocrystals. Here, the quantum dots or the nanocrystals may include fine particles of a conductive material, e.g., metal or semiconductor. The charge storage layer 664 may include silicon nitride, boron nitride, silicon boron nitride, or polysilicon doped with impurities.

The blocking insulating layer 666 may include a high-k dielectric material. The high-k dielectric material denotes a dielectric material having a dielectric constant that is greater than that of a silicon oxide layer. The blocking insulating layer 666 may include a single-layered structure or stacked layers including silicon oxide, silicon nitride, hafnium oxide, aluminium oxide, zirconium oxide, or tantalum oxide.

A drain region 670 may be disposed to cover the embedded insulating layer 675 and be electrically connected to the channel layer 673 above the memory cell string. The drain region 670 may include, e.g., polysilicon doped with impurities. The drain region 670 may act as a drain region of the string selection transistor SST.

In addition, source regions 605 of the ground selection transistors GSTs (see FIG. 18) arranged in the x-axis direction under the memory cell string may be disposed under the memory cell string. The source regions 605 may be spaced apart from one another in the y-axis direction, extending in the x-axis direction to be adjacent to the upper surface of the semiconductor layer 615. For example, the source region 605 may be arranged with respect to every two channel layers 673 in the y-axis direction, but is not limited thereto. The separation insulating layer 607 may be formed on the source region 605. If the source region 605 has a conductive type that is opposite to the semiconductor layer 615, the source region 605 may act as a source region of the adjacent ground selection transistors GST, and may be connected to a common source line CSL of FIG. 18.

The cross-sectional views of FIGS. 17C and 17D show pad regions that are formed by extending the plurality of gate electrode layers 650 and the plurality of insulating layers 640 to different lengths along the y-axis direction and a plurality of wiring structures 680 (including 681 to 689) that are electrically connected to the gate electrode layers 650 and at least some of the plurality of peripheral circuit gate structures 620 on the pad regions. The wiring structures 680 (including 681 to 689) may each include a vertical contact formed in a pad insulating layer 690 of the pad region and an upper wiring layer located on the vertical contact.

The semiconductor chip 1100 may include the peripheral circuit region PE including the peripheral circuit gate structures 620 and the wiring layer 625 disposed under the cell region CE. Therefore, an area in the x-axis and y-axis directions for forming the peripheral circuit region PE may be reduced, and thus, a degree of integration of the semiconductor chip 1100 may increase and a chip size may be reduced.

The plurality of gate insulating layers 650 and the plurality of insulating layers 640 extend along the y-axis direction to different lengths to provide the pad regions, and at least some of the gate electrode layer 650 and the plurality of peripheral circuit gate structures 620 may be electrically connected to the wiring structure 680 in the pad regions.

The wiring structure 689 from among the plurality of wiring structures 680 may be a peripheral circuit wiring structure that is electrically connected to the peripheral circuit in the pad region. The wiring structures 681 to 688 from among the wiring structures 680 may be electrically connected to the memory cells in the cell region. In FIGS. 17C and 17D, only one of the plurality of wiring layers 625 is shown to be connected to a contact plug 689, but the wiring layers 625 may be connected to different contact plugs at different locations in the x-axis direction of FIG. 17A.

FIG. 18 is an equivalent circuit diagram of a memory cell array in the semiconductor chip according to some example embodiments.

In detail, the memory cell array according to some example embodiments includes n memory cell devices MC1 to MCn that are connected in series, and a plurality of memory cell strings including the ground selection transistors GST and the string selection transistors SST that are connected to opposite ends of the memory cell devices MC1 to MCn in series.

The n memory cell devices MC1 to MCn connected to one another in series may be respectively connected to the word lines WL1 to WLn for selecting at least some of the memory cell devices MC1 to MCn. Gate terminals of the ground selection transistors GST are connected to the ground selection lines GSL, and source terminals of the ground selection transistors GST may be connected to the common source line CSL. In addition, gate terminals of the string selection transistors SST may be connected to the string selection lines SSL and source terminals of the string selection transistors SST may be connected to a drain terminal of the memory cell device MCn. In FIG. 18, one of the ground selection transistors GST and one of the string selection transistors SST are connected to each of the n memory cell devices MC1 to MCn that are connected to one another in series, but a plurality of ground selection transistors GST or a plurality of string selection transistors SST may be connected to each of the n memory cell devices MC1 to MCn.

Drain terminals of the string selection transistors SST may be connected to bit lines BL1 to BLm. When a signal is applied to the gate terminal of the string selection transistor SST via the string selection line SSL, signals applied through the bit lines BL1 to BLm may be transferred to the memory cell devices MC1 to MCn that are connected to one another in series so as to perform a data reading or writing operation. In addition, a signal is applied via the gate selection lines GSL to the gate terminals of the gate selection transistors GST, the source terminals of which are connected to the common source line CSL, and thus, an erasing operation for erasing all the charges stored in the n memory cell devices MC1 to MCn may be performed.

Figure 19:
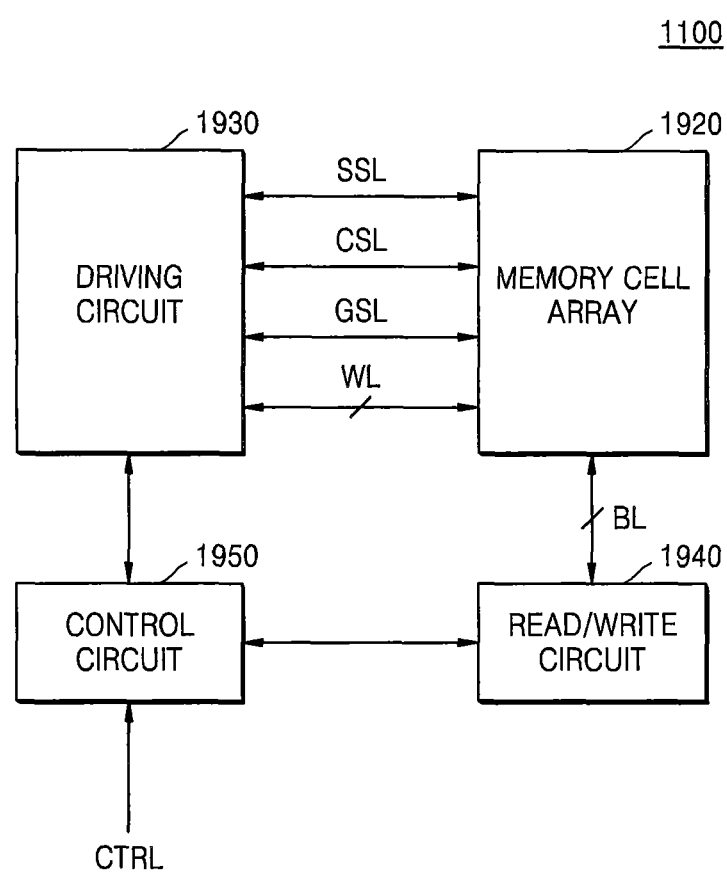
FIG. 19 is a schematic block diagram of a semiconductor chip according to some embodiments.

FIG. 19 is a schematic block diagram of the semiconductor chip 1100 according to some example embodiments.

In detail, the semiconductor chip 1100 according to some example embodiments may include a memory cell array 1920, a driving circuit 1930, a read/write circuit 1940, and a control circuit 1950. The memory cell array 1920 may include a plurality of memory cells, and the plurality of memory cells may be arranged along a plurality of columns and a plurality of rows. The plurality of memory cells included in the memory cell array 1920 may be connected to the driving circuit 1930 via the word lines WL, the common source line CSL, the string selection lines SSL, and the ground selection lines GSL, and may be connected to the read/write circuit 1940 via the bit lines BL.

In some example embodiments, the plurality of memory cells arranged along the same row are connected to the same word line WL, and the plurality of memory cells arranged along the same column may be connected to the same bit line BL. The plurality of memory cells included in the memory cell array 1920 may be classified as a plurality of memory blocks.

Each of the memory blocks may include a plurality of word lines WL, a plurality of string selection lines SSL, a plurality of ground selection lines GSL, a plurality of bit lines BL, and at least one common source line CSL. The driving circuit 1930 and the read/write circuit 1940 may be driven by the control circuit 1950.

In some example embodiments, the driving circuit 1930 receives address information from outside (e.g., from external to the driving circuit 1930), and decodes the address information to select at least some of the word lines WL, the common source line CSL, the string selection lines SSL, and the ground selection lines GSL connected to the memory cell array. The driving circuit 1930 may include driving circuits for driving the word lines WL, the string selection lines SSL, and the common source line CSL.

The read/write circuit 1940 may select at least some of the bit lines BL connected to the memory cell array 1920 according to a command transmitted from the control circuit 1950. The read/write circuit 1940 may read data stored in the memory cell connected to the selected at least some of the bit lines BL, or may write data in the memory cell connected to the selected at least some of the bit lines BL. The read/write circuit 1940 may include circuits such as a page buffer, an input/output buffer, and a data latch in order to perform the above read/write operations.

The control circuit 1950 may control operations of the driving circuit 1930 and the read/write circuit 1940 in response to a control signal CTRL transmitted from outside (e.g., from external to the control circuit 1950). When data stored in the memory cell array 1920 is read, the control circuit 1950 may control the operation of the driving circuit 1930 to supply a voltage for the read operation to the word line WL in which the data to be read is stored. When the voltage for the read operation is applied to a certain word line WL, the control circuit 1950 may control the read/write circuit 1940 to read the data stored in the memory cell connected to the word line WL, to which the voltage for the read operation is applied.

In addition, when data is written on the memory cell array 1920, the control circuit 1950 may control an operation of the driving circuit 1930 to supply a voltage for the write operation to the word line WL, on which the data is to be written. When the voltage for the write operation is applied to the certain word line WL, the control circuit 1950 may control the read/write circuit 1940 to write the data on the memory cell connected to the word line WL, to which the voltage for the write operation is applied.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor chip comprising:
   a peripheral circuit region on a surface of a substrate;
   a semiconductor layer on the peripheral circuit region;
   a layer that is electrically connected to, and extends laterally in a first direction adjacent a side of, the semiconductor layer, wherein the first direction and a second direction are perpendicular to each other and are parallel to the surface of the substrate, and wherein, in a plan view, the layer extends shorter distances in the first direction and the second direction, respectively, than the semiconductor layer; and
   a cell region on the semiconductor layer.

2. The semiconductor chip of claim 1, wherein the layer that is electrically connected to the semiconductor layer is at a same layer level as the semiconductor layer.

3. The semiconductor chip of claim 1, wherein the semiconductor layer and the layer that is electrically connected to the semiconductor layer comprise a same material.

4. The semiconductor chip of claim 3, wherein the semiconductor layer and the layer that is electrically connected to the semiconductor layer comprise respective polysilicon layers.

5. The semiconductor chip of claim 3, wherein the semiconductor layer and the layer that is electrically connected to the semiconductor layer comprise respective single crystalline silicon layers.

6. The semiconductor chip of claim 1, wherein the layer that is electrically connected to the semiconductor layer comprises a conductive layer.

7. The semiconductor chip of claim 1, further comprising a pad region at a side of the cell region.

8. The semiconductor chip of claim 7, wherein the pad region overlaps the layer that is electrically connected to the semiconductor layer in a third direction perpendicular to the surface of the substrate.

9. The semiconductor chip of claim 7, wherein the pad region overlaps the semiconductor layer in a third direction perpendicular to the surface of the substrate.

10. A semiconductor chip comprising:
    a peripheral circuit on a substrate;
    a semiconductor layer on the peripheral circuit;
    a layer at a same layer level as the semiconductor layer and electrically connected to a portion of the semiconductor layer, wherein the layer laterally protrudes from the semiconductor layer and is narrower, in a plan view, than the peripheral circuit; and
    a cell region on the semiconductor layer and comprising a transistor of a memory cell.

11. The semiconductor chip of claim 10, wherein the layer that is at the same layer level as the semiconductor layer and is electrically connected to the portion of the semiconductor layer is at a boundary region of the semiconductor layer and comprises a polysilicon layer or a single crystalline silicon layer.

12. The semiconductor chip of claim 10, wherein the memory cell overlaps the peripheral circuit on the substrate.

13. The semiconductor chip of claim 10, wherein the peripheral circuit comprises a page buffer, a latch circuit, a cache circuit, a row decoder, a column decoder, a sense amplifier, or a data in/out circuit.

14. The semiconductor chip of claim 10, further comprising a peripheral circuit wiring structure in the cell region and electrically connected to the peripheral circuit.

15. A semiconductor chip comprising:
    a substrate;
    a memory cell region on the substrate;
    a peripheral circuit region between the memory cell region and the substrate, wherein the peripheral circuit region comprises circuitry configured to process data input into and/or output from the memory cell region;
    a semiconductor layer between the memory cell region and the peripheral circuit region; and
    a connector that extends laterally from a perimeter portion of the semiconductor layer,
    wherein an outermost portion of the connector comprises a cut portion of the semiconductor chip, and
    wherein, in a plan view, the outermost portion of the connector is narrower, in a cut direction of the connector, than the semiconductor layer.

16. The semiconductor chip of claim 15, wherein the connector comprises a conductive material or a same material as the semiconductor layer.

17. The semiconductor chip of claim 16,
wherein the connector comprises a first connector on a first side of the semiconductor layer, and
wherein the semiconductor chip further comprises a second connector on a second side of the semiconductor layer.

18. The semiconductor chip of claim 15, wherein the connector defines a portion of an outermost edge of the semiconductor chip.

19. The semiconductor chip of claim 15,
wherein the semiconductor layer comprises a well region, and
wherein the connector is adjacent the well region of the semiconductor layer.

20. The semiconductor chip of claim 15, wherein the cut direction of the connector comprises a first direction that is perpendicular to a second direction in which the connector extends laterally from the perimeter portion of the semiconductor layer.

* * * * *